US012648214B2

(12) United States Patent
Chang et al.

(10) Patent No.: US 12,648,214 B2
(45) Date of Patent: Jun. 2, 2026

(54) MULTI-GATE DEVICE FABRICATION METHODS AND RELATED STRUCTURES

(71) Applicant: Taiwan Semiconductor Manufacturing Company, Ltd., Hsinchu (TW)

(72) Inventors: Cheng-Wei Chang, Hsinchu (TW); Chi-Yu Chou, Hsinchu County (TW); Lun-Kuang Tan, Hsinchu City (TW); Shuen-Shin Liang, Hsinchu County (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 580 days.

(21) Appl. No.: 18/181,750

(22) Filed: Mar. 10, 2023

(65) Prior Publication Data

US 2024/0120239 A1     Apr. 11, 2024

Related U.S. Application Data

(60) Provisional application No. 63/378,464, filed on Oct. 5, 2022.

(51) Int. Cl.
*H10D 84/03*          (2025.01)
*H10D 30/01*          (2025.01)
(Continued)

(52) U.S. Cl.
CPC ......... *H10D 84/038* (2025.01); *H10D 30/014* (2025.01); *H10D 30/6735* (2025.01);
(Continued)

(58) Field of Classification Search
CPC ............ H10D 30/014; H10D 30/6735; H10D 84/0144; H10D 84/0177; H01L 21/28185
See application file for complete search history.

(56) References Cited

U.S. PATENT DOCUMENTS 8,796,666 B1     8/2014  Huang et al.
8,815,712 B2     8/2014  Wan et al.
(Continued)

FOREIGN PATENT DOCUMENTS

KR     20160139814 A     12/2016
KR     20200137256 A     12/2020
(Continued)

OTHER PUBLICATIONS

International Roadmap for Devices and Systems. 2017 Edition—More Moore. New York: IEEE, 2018., 36 pp.

Primary Examiner — Brian Turner
(74) Attorney, Agent, or Firm — Haynes and Boone, LLP

(57) ABSTRACT

A method for modulating a threshold voltage of a device. The method includes providing a fin extending from a substrate, where the fin includes a plurality of semiconductor channel layers defining a channel region for a P-type transistor. In some embodiments, the method further includes forming a first gate dielectric layer surrounding at least three sides of each of the plurality of semiconductor channel layers of the P-type transistor. Thereafter, the method further includes forming a P-type metal film surrounding the first gate dielectric layer. In an example, and after forming the P-type metal film, the method further includes annealing the semiconductor device. After the annealing, and in some embodiments, the method includes removing the P-type metal film.

20 Claims, 20 Drawing Sheets

(51) Int. Cl.
| | |
|---|---|
| *H10D 30/67* | (2025.01) |
| *H10D 62/10* | (2025.01) |
| *H10D 84/01* | (2026.01) |

(52) U.S. Cl.
CPC ....... *H10D 62/121* (2025.01); *H10D 84/0167* (2025.01); *H10D 84/0193* (2025.01)

(56) References Cited

U.S. PATENT DOCUMENTS

| | | | |
|---|---|---|---|
| 8,963,258 B2 | 2/2015 | Yu et al. | |
| 9,093,530 B2 | 7/2015 | Huang et al. | |
| 9,171,929 B2 | 10/2015 | Lee et al. | |
| 9,214,555 B2 | 12/2015 | Oxland et al. | |
| 9,236,267 B2 | 1/2016 | De et al. | |
| 9,520,482 B1 | 12/2016 | Chang et al. | |
| 9,548,303 B2 | 1/2017 | Lee et al. | |
| 9,576,814 B2 | 2/2017 | Wu et al. | |
| 10,825,736 B1 * | 11/2020 | Zhang | H10D 84/0144 |
| 2013/0285116 A1 | 10/2013 | Lochtefeld et al. | |
| 2017/0025315 A1 | 1/2017 | Ando | |
| 2020/0294865 A1 * | 9/2020 | Cheng | H10D 62/121 |
| 2020/0373400 A1 * | 11/2020 | Cheng | H10D 30/6757 |
| 2021/0366783 A1 | 11/2021 | Chu | |
| 2021/0375629 A1 | 12/2021 | Lai | |
| 2021/0399104 A1 | 12/2021 | Chang | |
| 2022/0216327 A1 | 7/2022 | More | |
| 2022/0254900 A1 | 8/2022 | Yang | |
| 2022/0375935 A1 * | 11/2022 | Yim | H10D 30/43 |
| 2023/0069421 A1 * | 3/2023 | Lee | H10D 64/01 |
| 2023/0317807 A1 * | 10/2023 | Lavric | H10D 30/43 |
| | | | 257/368 |

FOREIGN PATENT DOCUMENTS

| | | |
|---|---|---|
| KR | 20210156765 B1 | 12/2021 |
| KR | 20220032068 A | 3/2022 |
| KR | 20220037927 A | 3/2022 |
| TW | 202129979 A | 8/2021 |
| TW | 202230796 A | 8/2022 |
| TW | 202232755 A | 8/2022 |

* cited by examiner

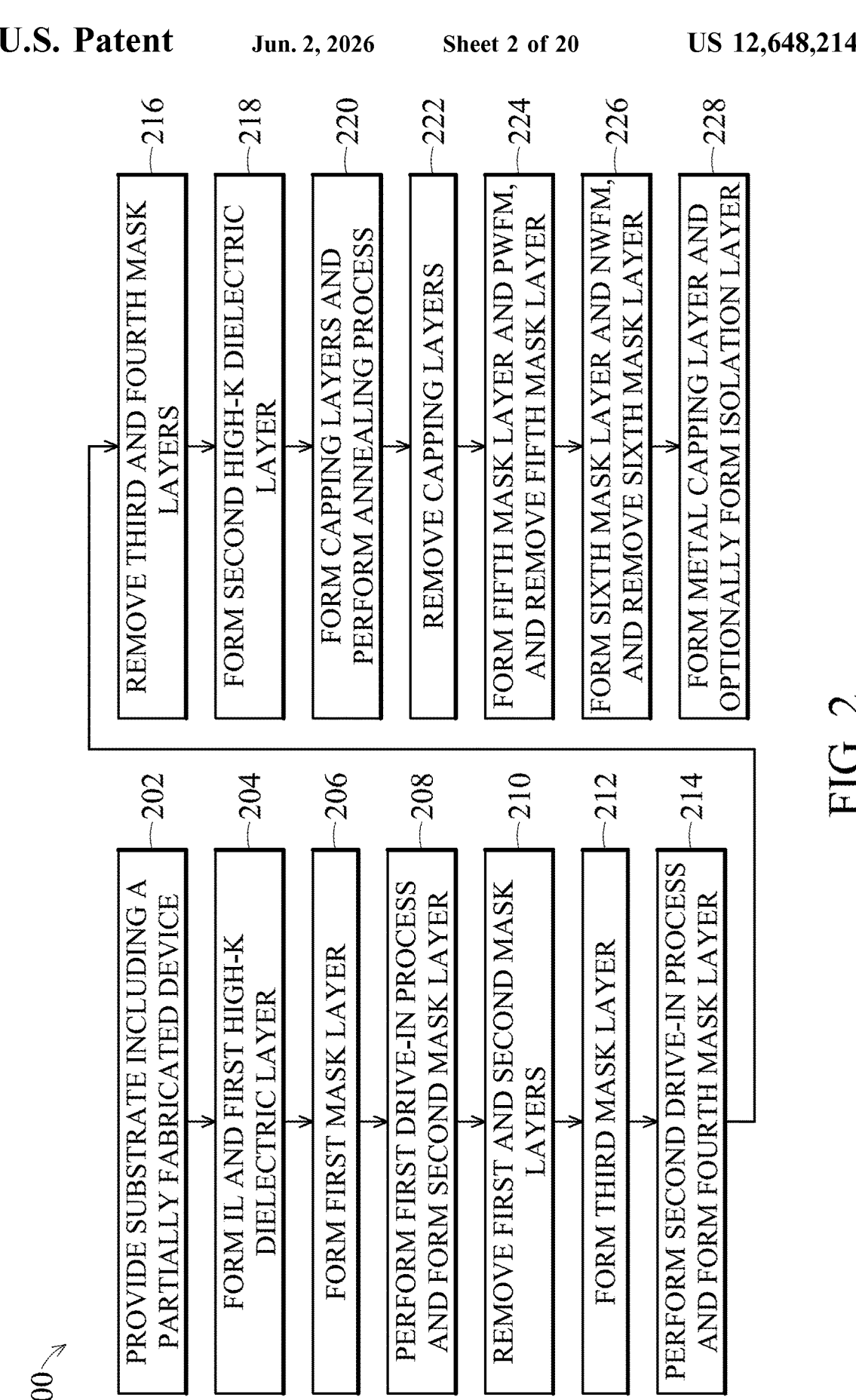

200

PROVIDE SUBSTRATE INCLUDING A PARTIALLY FABRICATED DEVICE — 202

FORM IL AND FIRST HIGH-K DIELECTRIC LAYER — 204

FORM FIRST MASK LAYER — 206

PERFORM FIRST DRIVE-IN PROCESS AND FORM SECOND MASK LAYER — 208

REMOVE FIRST AND SECOND MASK LAYERS — 210

FORM THIRD MASK LAYER — 212

PERFORM SECOND DRIVE-IN PROCESS AND FORM FOURTH MASK LAYER — 214

REMOVE THIRD AND FOURTH MASK LAYERS — 216

FORM SECOND HIGH-K DIELECTRIC LAYER — 218

FORM CAPPING LAYERS AND PERFORM ANNEALING PROCESS — 220

REMOVE CAPPING LAYERS — 222

FORM FIFTH MASK LAYER AND PWFM, AND REMOVE FIFTH MASK LAYER — 224

FORM SIXTH MASK LAYER AND NWFM, AND REMOVE SIXTH MASK LAYER — 226

FORM METAL CAPPING LAYER AND OPTIONALLY FORM ISOLATION LAYER — 228

FIG. 2

MULTI-GATE DEVICE FABRICATION METHODS AND RELATED STRUCTURES

CROSS-REFERENCE TO RELATED APPLICATION

This application claims the benefit of U.S. Provisional Application No. 63/378,464, filed Oct. 5, 2022, the entirety of which is incorporated by reference herein.

BACKGROUND

The electronics industry has experienced an ever-increasing demand for smaller and faster electronic devices which are simultaneously able to support a greater number of increasingly complex and sophisticated functions. Accordingly, there is a continuing trend in the semiconductor industry to manufacture low-cost, high-performance, and low-power integrated circuits (ICs). Thus far these goals have been achieved in large part by scaling down semiconductor IC dimensions (e.g., minimum feature size) and thereby improving production efficiency and lowering associated costs. However, such scaling has also introduced increased complexity to the semiconductor manufacturing process. Thus, the realization of continued advances in semiconductor ICs and devices calls for similar advances in semiconductor manufacturing processes and technology.

Recently, multi-gate devices have been introduced in an effort to improve gate control by increasing gate-channel coupling, reduce OFF-state current, and reduce short-channel effects (SCEs). Examples of such multi-gate devices include the gate-all-around (GAA) transistor and the forksheet transistor. GAA transistors include a gate structure that may extend completely around the channel, and forksheet transistors include a gate structure that extends around three sides of the channel, both of which provide excellent electrostatic control of the channel. GAA and forksheet transistors also provide high drive currents and are compatible with conventional complementary metal-oxide-semiconductor (CMOS) processes. Further, their three-dimensional structure allows them to be aggressively scaled while maintaining gate control and mitigating SCEs. Forksheet transistors additionally provide much tighter spacing between N-type and P-type devices, resulting in enhanced area and performance scalability.

However, despite having many desirable features, GAA and forksheet transistor fabrication continues to face challenges as a result of the ongoing scaling down of semiconductor IC dimensions. Thus, existing techniques have not proved entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2 is a flow chart of a method of fabrication of a multi-gate device, in accordance with some embodiments;

DETAILED DESCRIPTION

Figure 1:
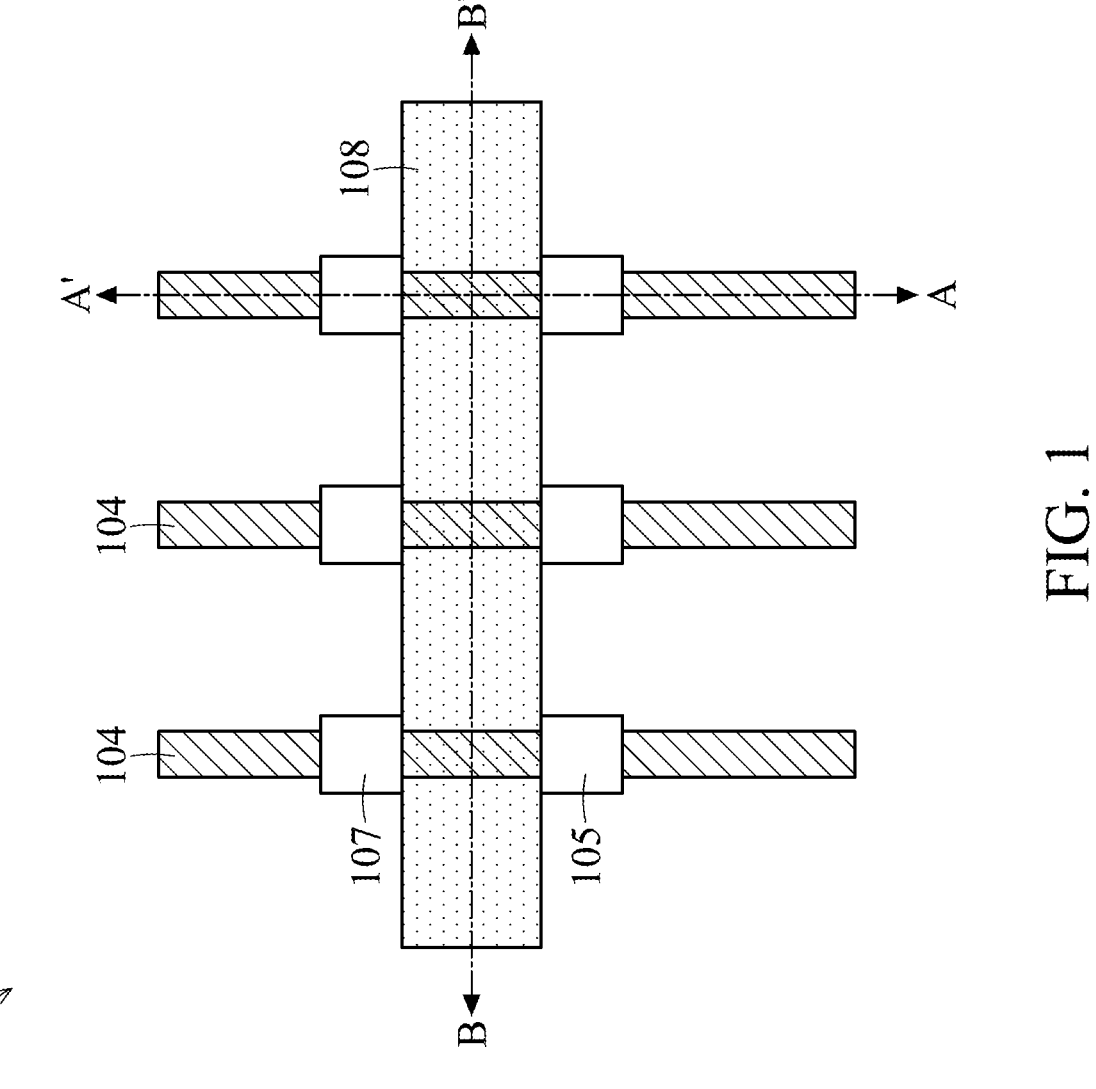
FIG. 1 provides a simplified top-down layout view of a multi-gate device, such as a GAA transistor, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Additionally, in the discussion that follows, dimensions (e.g., such as thickness, width, length, etc.) for a given layer or other feature may at times be described using terms such as "substantially equal", "equal", or "about", where such terms are understood to mean within +/−10% of the recited value or between compared values. For instance, if dimension A is described as being "substantially equal" to dimension B, it will be understood that dimension A is within +/−10% of dimension B. As another example, if a layer is described as having a thickness of about 100 nm, it will be understood that the thickness of the layer may in a range between 90-110 nm.

It is also noted that the present disclosure presents embodiments in the form of multi-gate transistors, including methods of gate stack formation such transistors. Multi-gate transistors include those transistors whose gate structures are formed on at least two-sides of a channel region. These multi-gate devices may include a P-type device or an N-type device. Specific examples may be presented and referred to herein as FinFETs, on account of their fin-like structure. Also presented herein are embodiments of a type of multi-gate transistor referred to as a gate-all-around (GAA) transistor. A GAA transistor includes any device that has its gate structure, or portion thereof, formed on 4-sides of a channel region (e.g., surrounding a portion of a channel region). Still other embodiments presented herein include forksheet (or nano-comb) transistors, which have a gate structure formed on 3-sides of a channel region. The forked structure of the forksheet transistor is realized by introducing a dielectric wall in between P-type and N-type devices, where spacing between the P-type and N-type devices is substantially equal to a width of the intervening dielectric wall. As a result, forksheet transistors provide much tighter spacing between N-type and P-type devices, resulting in enhanced area and performance scalability.

Devices presented herein also include embodiments that have channel regions disposed in semiconductor channel layers. In various embodiments, the semiconductor channel layers may include nanosheet channel(s), nanowire channel (s), bar-shaped channel(s), and/or other suitable channel configurations. Presented herein are embodiments of devices that may have one or more channel regions (e.g., semiconductor channel layers) associated with a single, contiguous gate structure. However, one of ordinary skill would recognize that the teaching can apply to a single channel (e.g., single semiconductor channel layer) or any number of channels. One of ordinary skill may recognize other examples of semiconductor devices that may benefit from aspects of the present disclosure.

In various applications, it may be desirable to adjust the threshold voltage (Vt) of one or more particular multi-gate transistors. Modulation of the threshold voltage may be achieved by using a work function (WF) metal layer to modulate a flatband voltage (Vfb) of the multi-gate transistor. In general, and as used herein, a WF metal layer may be formed over a gate dielectric layer and may describe one or more layers which are used to set a work function value for a gate electrode of a multi-gate device. In at least some existing implementations, a TiN layer, or a film stack that includes TiN, may be formed around a semiconductor channel layer (e.g., around a gate dielectric layer that is formed around the semiconductor channel layer) to modulate the flatband voltage of the multi-gate transistor. This method may be used, for instance, to modulate the flatband voltage of P-type multi-gate transistors. P-type multi-gate transistors, as merely one example, may be used as pull-up transistors in static random-access memory (SRAM) devices, where the threshold voltage (Vt) of such devices greatly affects SRAM device performance and reliability. With the continued progress of semiconductor manufacturing processes, the distance between any two adjacent semiconductor channel layers of a multi-gate transistor (e.g., such as a P-type multi-gate transistor) decreases, making it quite challenging to insert thick TiN film stacks within the limited distance between the adjacent semiconductor channel layers to adjust the flatband voltage of the multi-gate transistor.

Embodiments of the present disclosure offer advantages over the existing art, though it is understood that other embodiments may offer different advantages, not all advantages are necessarily discussed herein, and no particular advantage is required for all embodiments. For example, embodiments discussed herein include methods and structures for modulating the threshold voltage of highly scaled P-type transistors (e.g., such as GAA transistors or forksheet transistors). In some examples, the disclosed method provides a P-type metal film stack (PMS) drive-in process to modulate the threshold voltage. For instance, in some embodiments and as a first step of the PMS drive-in process, a PMS layer is formed over a gate dielectric layer surrounding a semiconductor channel layer of a multi-gate device. The PMS film, in various cases, may include at least one of Al, Ti, or N. After forming the PMS layer, and as a second step of the PMS drive-in process, an annealing process is performed to cause the at least one of the Al, Ti, or N to diffuse into the gate dielectric layer (e.g., into a high-K layer), thereby effectively modulating the threshold voltage (Vt) of the multi-gate device. After performing the annealing process, and as a third step of the PMS drive-in process, the PMS layer is removed. Thereafter, device processing may continue. In accordance with embodiments of the present disclosure, the PMS drive-in process may thus be used to adjust the flatband voltage of a multi-gate transistor (e.g., such as a P-type GAA transistor or a P-type forksheet transistor), so as to obtain an expected threshold voltage (Vt) of the multi-gate transistor. It is also noted that since the PMS layer is removed after the annealing process is performed, the PMS drive-in process may still be performed even in the situation that the distance between adjacent semiconductor channel layers is limited (e.g., such as when the distance between adjacent semiconductor channel layers is in a range of between about 5-15 nm). It is also noted that while embodiments of the present disclosure may be primarily discussed with reference to P-type transistors, it will be understood that the embodiments disclosed herein may in some cases be applied to N-type transistors.

For purposes of the discussion that follows, FIG. 1 provides a simplified top-down layout view of a multi-gate device 100. In various embodiments, the multi-gate device 100 may include a FinFET device, a GAA transistor, or other type of multi-gate device. The multi-gate device 100 may include a plurality of fin elements 104 extending from a substrate, a gate structure 108 disposed over and around the fin elements 104, and source/drain features 105, 107 formed in source/drain regions adjacent to and on either side of the gate structure 108, where the source/drain features 105, 107 are formed in, on, and/or surrounding the fins 104. A channel region of the multi-gate device 100, which may include a plurality of semiconductor channel layers (e.g., when the multi-gate device 100 includes a GAA transistor), is disposed within the fins 104, underlying the gate structure 108, along a plane substantially parallel to a plane defined by section AA' of FIG. 1. In some embodiments, sidewall spacers may also be formed on sidewalls of the gate structure 108.

Referring to FIG. 2, illustrated therein is a method 200 of semiconductor fabrication including fabrication of a semiconductor device 300 (e.g., which includes a multi-gate device), in accordance with various embodiments. The method 200 is initially discussed below with reference to fabrication of GAA transistors. However, it will be understood that aspects of the method 200 may be equally applied to other types of multi-gate devices such as forksheet transistors, or to other types of devices implemented by the multi-gate devices, without departing from the scope of the present disclosure. In particular, embodiments of the present disclosure directed to forksheet transistor implementations are discussed in more detail below with respect to FIGS. 18-33 and corresponding semiconductor devices 1800, 1900. With respect to GAA transistor implementations how-ever, the method 200 is initially discussed with reference to FIGS. 3-17, which provide cross-sectional views of an embodiment of the semiconductor device 300 along a plane substantially parallel to a plane defined by section BB' of FIG. 1 (e.g., along the direction of the gate structure 108). In some embodiments, the method 200 may be used to fabricate the multi-gate device 100, described above with reference to FIG. 1. Thus, one or more aspects discussed above with reference to the multi-gate device 100 may also apply to the method 200. It is understood that the method 200 includes steps having features of a complementary metal-oxide-semiconductor (CMOS) technology process flow and thus, are only described briefly herein. Also, additional steps may be performed before, after, and/or during the method 200.

It is further noted that, in some embodiments, the semi-conductor device 300 and the semiconductor device 1900 (discussed further below) may include various other devices and features, such as other types of devices such as addi-tional transistors, bipolar junction transistors, resistors, capacitors, inductors, diodes, fuses and/or other logic cir-cuits, etc., but is simplified for a better understanding of the inventive concepts of the present disclosure. In some embodiments, the semiconductor device 300 and the semi-conductor device 1900 include a plurality of semiconductor devices (e.g., transistors) which may be interconnected. Moreover, it is noted that the process steps of method 200, including any descriptions given with reference to the fig-ures are merely exemplary and are not intended to be limiting beyond what is specifically recited in the claims that follow.

The method 200 begins at block 202 where a substrate including a partially fabricated device is provided. Referring to the example of FIG. 3, in an embodiment of block 202, a partially fabricated device 300 is provided. The device 300 is formed on a substrate. In some embodiments, the substrate may be a semiconductor substrate such as a silicon substrate. The substrate may include various layers, including conduc-tive or insulating layers formed on a semiconductor sub-strate. The substrate may include various doping configu-rations depending on design requirements as is known in the art. The substrate may also include other semiconductors such as germanium, silicon carbide (SiC), silicon germa-nium (SiGe), or diamond. Alternatively, the substrate may include a compound semiconductor and/or an alloy semi-conductor. Further, the substrate may optionally include an epitaxial layer (epi-layer), may be strained for performance enhancement, may include a silicon-on-insulator (SOI) structure, and/or have other suitable enhancement features.

Figures 3, 4:
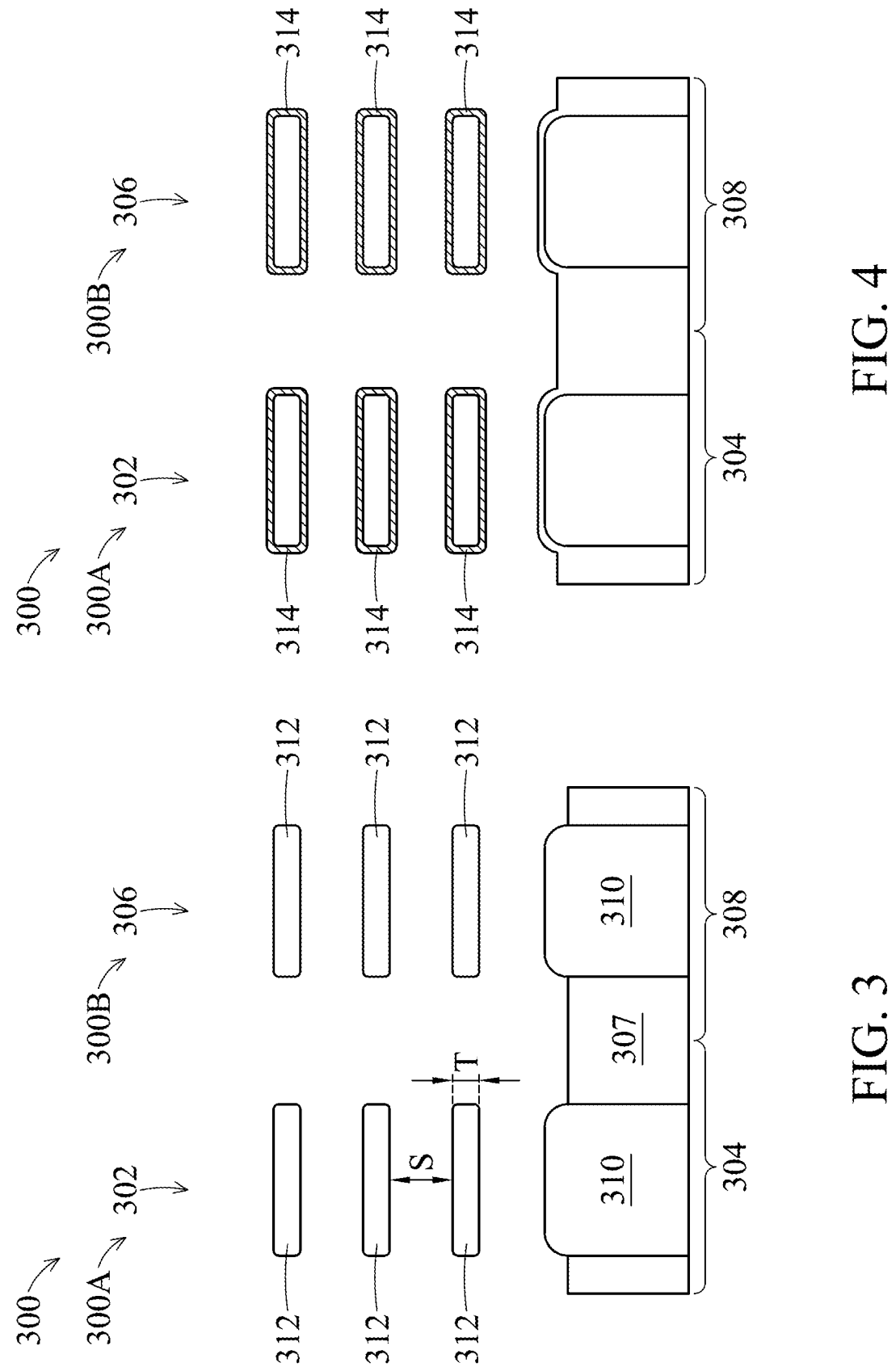
FIGS. 3, 4, 5, 6, 7, 8, 9, 10, 11, 12, 13, 14, 15, 16, and 17 provide cross-sectional views of an embodiment of a semiconductor device (e.g., such as a GAA device) along a plane substantially parallel to a plane defined by section BB' of FIG. 1, at different stages of processing according to the method of FIG. 2, in accordance with some embodiments.
Figures 5, 6:
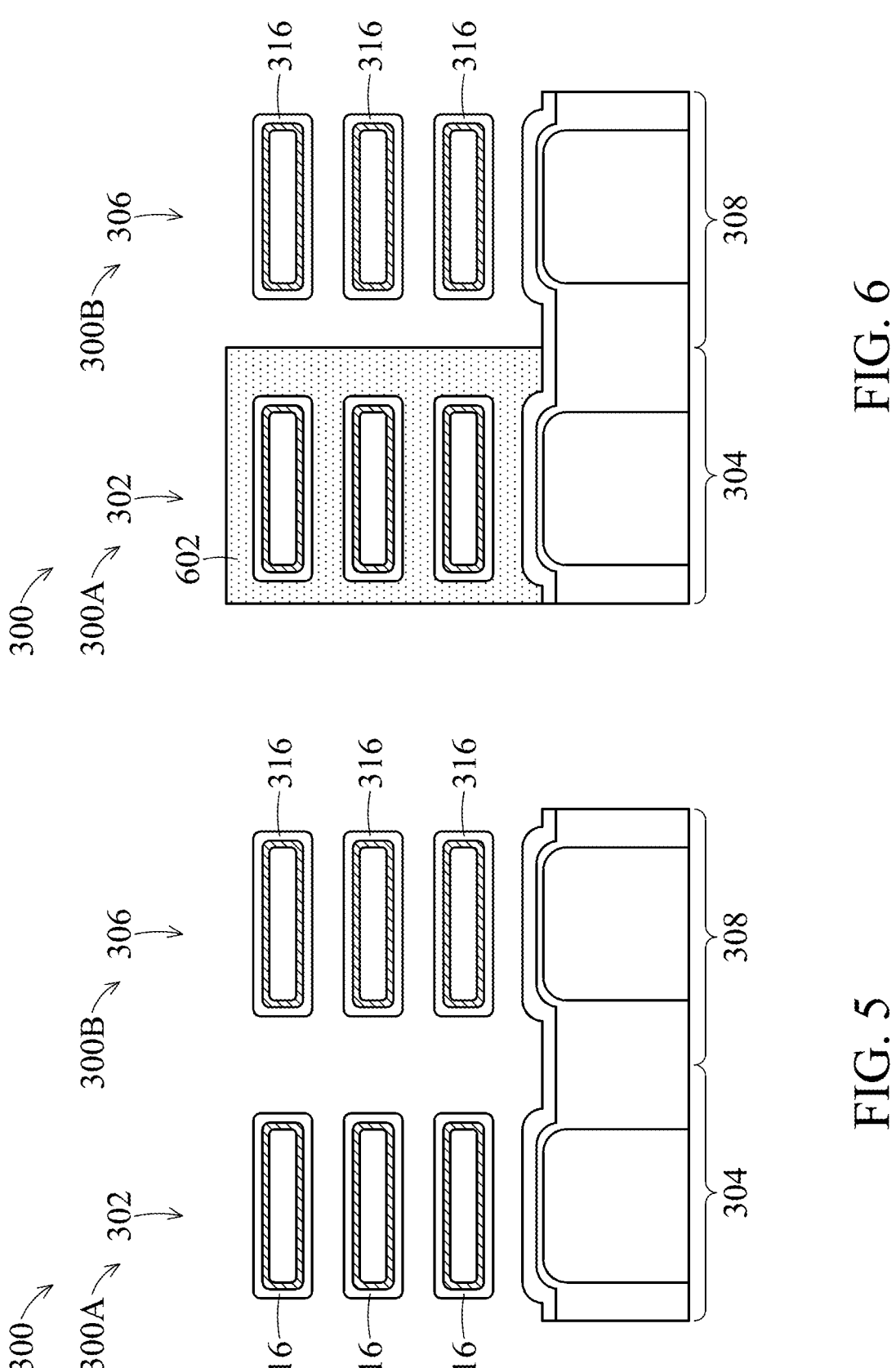
Figures 7, 8:
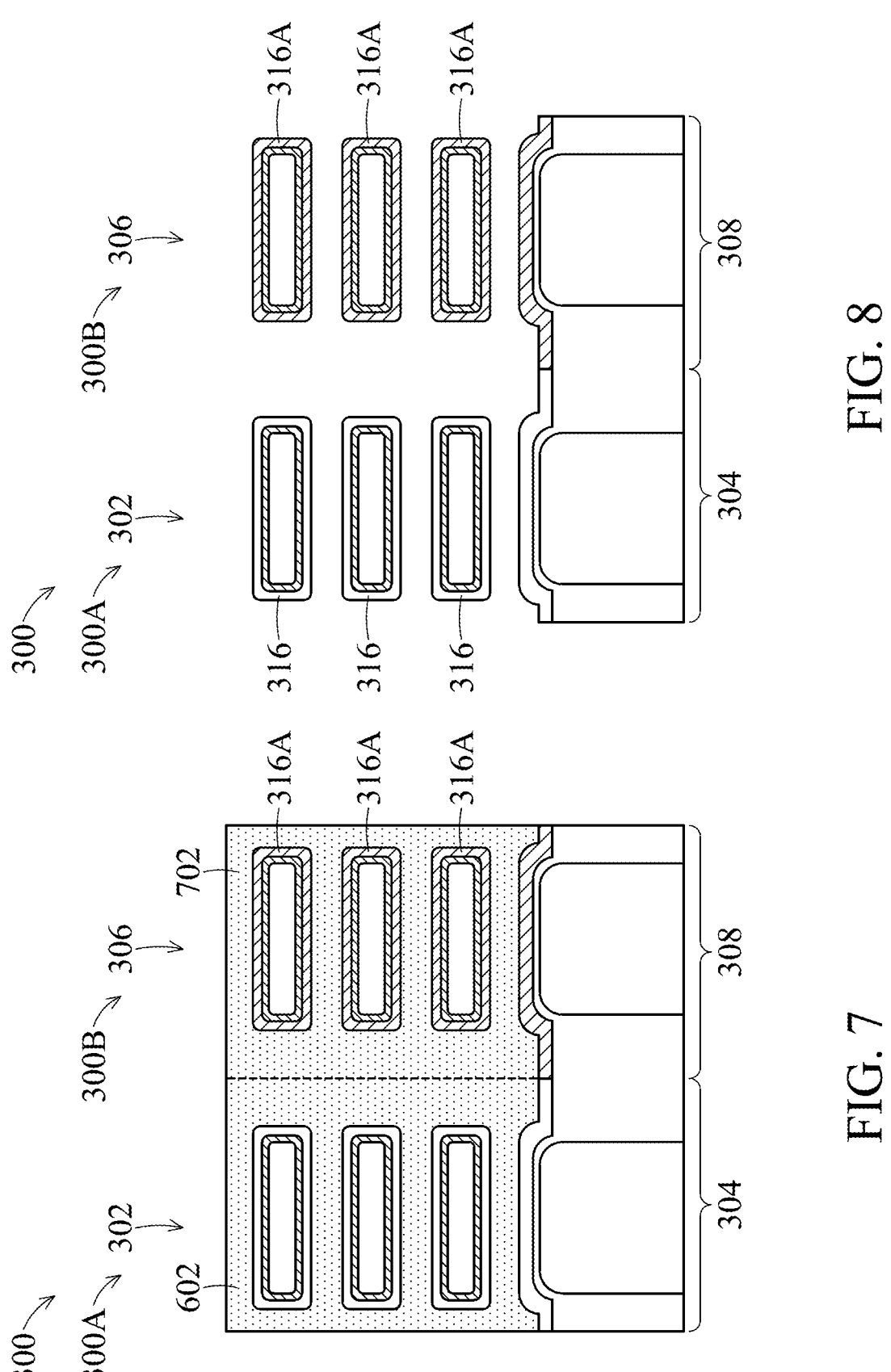

As shown in FIG. 3, the device 300 includes a P-type device 300A formed in a P-type device region 304 and an N-type device 300B formed in an N-type device region 308. In the present example, the P-type device region 304 and the N-type device region 308 are illustrated as being adjacent to each other. However, it will be understood that each of the P-type device region 304 and the N-type device region 308 may be formed in different areas of the substrate, without necessarily being directly adjacent to each other. In various embodiments, each of the P-type device 300A and the N-type device 300B include a partially fabricated GAA transistor having a plurality of channels disposed in semi-conductor channel layers. Specifically, in some examples, the P-type device 300A includes a fin 302 extending from the substrate and the N-type device 300B includes a fin 306 extending from the substrate. In some cases, shallow trench isolation (STI) features 307 may be formed to isolate the fin 302 from the fin 306 or from other neighboring fins. In some embodiments, each of the fins 302, 306 may include a substrate portion 310 (formed from the substrate) and a plurality of epitaxial layers 312, where the epitaxial layers 312 include semiconductor channel layers. In an embodi-ment, the epitaxial layers 312 include silicon (Si).

In various embodiments, the epitaxial layers 312 may form a channel region of a GAA transistor, the channel region disposed between respective source/drain regions, for each of the P-type device 300A and the N-type device 300B. For example, as noted above, the epitaxial layers 312 may be referred to as semiconductor channel layers that are used to form a channel region of a GAA transistor. In various embodiments, the semiconductor channel layers (e.g., the layers 312 or portions thereof) may include nanosheet channel(s), nanowire channel(s), bar-shaped channel(s), and/or other suitable channel configurations. The semicon-ductor channel layers may also be used to form portions of the source/drain features of the GAA transistor, in some embodiments.

It is noted that while the fins 302, 306 are illustrated as including three (3) layers of the epitaxial layer 312, this is for illustrative purposes only and not intended to be limiting beyond what is specifically recited in the claims. It can be appreciated that any number of epitaxial layers can be formed, where for example, the number of epitaxial layers depends on the desired number of semiconductor channel layers for the GAA transistor. In some embodiments, the number of epitaxial layers 312, and thus the number of semiconductor channel layers, is between 3 and 10. In some embodiments, the epitaxial layers 312 (the semiconductor channel layers) each have a thickness 'T' in a range of about 5-15 nm and a spacing 'S' between adjacent epitaxial layers 312 (semiconductor channel layers) is in a range of about 5-8 nm. As noted above, the epitaxial layers 312 may serve as channel region(s) for a subsequently formed multi-gate device (e.g., a GAA transistor) and its thickness, and spacing between adjacent epitaxial layers 312, may be chosen based at least in part on device performance considerations.

In various embodiments, the fins 302, 306 and their respective semiconductor channel layers (the epitaxial layer 312) may be formed by growing an epitaxial layer stack of layers of a first composition interposed by layers of a second composition. The layers of the first composition may include the semiconductor channel layers (the epitaxial layer 312, which may include Si), and the layers of the second com-position may include dummy layers (e.g., such as SiGe dummy layers). In some embodiments, epitaxial growth of the epitaxial layers stack is achieved by a molecular beam epitaxy (MBE) process, a chemical vapor deposition (CVD) process, a metalorganic chemical vapor deposition (MOCVD) process, other suitable epitaxial growth process, or combinations thereof.

Thereafter, a channel layer release process may be per-formed, where the dummy layers (e.g., SiGe dummy layers) in the channel regions of the device 300 may be selectively removed (e.g., using a selective etching process), while the semiconductor channel layers (the epitaxial layers 312) remain unetched. In some examples, selective removal of the dummy layers (e.g., the SiGe dummy layers) may be referred to as a channel layer release process (e.g., as the semiconductor channel layers are released from the dummy layers). In some embodiments, the selective etching process may include a selective wet etching process. In some cases, the selective wet etching includes ammonia and/or ozone. As merely one example, the selective wet etching process includes tetra-methyl ammonium hydroxide (TMAH). In some embodiments, the selective etching process may include a dry, plasma-free etching process performed using a CERTAS® Gas Chemical Etch System, available from Tokyo Electron Limited, Tokyo, Japan.

It is noted that as a result of the selective removal of the dummy layers (the SiGe dummy layers), gaps are formed between the adjacent semiconductor channel layers (the epitaxial layers 312) in the channel region of the device 300. By way of example, the gaps may serve to expose surfaces of the epitaxial layers 312, upon which one or more layers of a gate structure will be formed. For instance, as described in more detail below, portions of gate structures (e.g., including a metal gate stack having an interfacial layer, a high-K dielectric layer, and one or more metal electrode layers) will be formed within the gaps between adjacent semiconductor channel layers (the epitaxial layers 312). In some embodiments, after removing the dummy layers (the SiGe dummy layers), and prior to forming the portions of the gate structures, a sheet trim process (e.g., an etching process) may be performed to modify a profile of the semiconductor channel layers (e.g., the epitaxial layers 312) to achieve desired dimensions and/or desired shapes (e.g., cylindrical-shaped (e.g., nanowire), rectangular-shaped (e.g., nanobar), sheet-shaped (e.g., nanosheet), etc.) of the semiconductor channel layers.

The method 200 proceeds to block 204 where an interfacial layer (IL) and first high-K (HK) dielectric layer are formed. Referring to the examples of FIGS. 3 and 4, in an embodiment of block 204, an interfacial layer (IL) 314 is formed on exposed surfaces of the epitaxial layers 312 (semiconductor channel layers) and the substrate portion 310, including wrapping around (surrounding) the epitaxial layers 312 within the channel region of each of the P-type device 300A and the N-type device 300B. In a further embodiment of block 204, and with reference to the examples of FIGS. 4 and 5, a first high-K dielectric layer 316 is then formed over the IL 314, including wrapping around (surrounding) the IL 314 formed on surfaces of the epitaxial layers 312. In various embodiments, the IL 314 and the first high-K dielectric layer 316 may collectively define a gate dielectric, or at least part of a gate dielectric, of the gate structure for each of the P-type device 300A and the N-type device 300B. In some embodiments, the IL 314 has a thickness of about 0.5-1.5 nm, the first high-K dielectric layer 316 has a thickness of about 0.5-1.5 nm. High-K gate dielectrics, as used and described herein, include dielectric materials having a high dielectric constant, for example, greater than that of thermal silicon oxide (~3.9).

In some embodiments, the IL 314 may include a dielectric material such as silicon oxide ($SiO_2$), HfSiO, or silicon oxynitride (SiON). In some examples, the first high-K dielectric layer 316 may include hafnium dioxide ($HfO_2$), or more generally, hafnium oxide ($HfO_x$). Alternatively, the first high-K dielectric layer 316 may include other high-K dielectrics, such as $TiO_2$, HfZrO, $Ta_2O_3$, $HfSiO_4$, $ZrO_2$, $ZrSiO_2$, LaO, AlO, ZrO, TiO, $Ta_2O_5$, $Y_2O_3$, $SrTiO_3$ (STO), $BaTiO_3$ (BTO), BaZrO, HfZrO, HfLaO, HfSiO, LaSiO, AlSiO, HfTaO, HfTiO, $(Ba,Sr)TiO_3$ (BST), $Al_2O_3$, $La_2O_3$, $Si_3N_4$, oxynitrides (SiON), combinations thereof, or other suitable material. In various embodiments, the gate dielectric may be formed by thermal oxidation, ALD, physical vapor deposition (PVD), pulsed laser deposition (PLD), CVD, and/or other suitable methods.

The method 200 proceeds to block 206 where a first mask layer is formed. Referring to the example of FIGS. 5 and 6, in an embodiment of block 206, a first mask layer may be deposited and patterned to form a patterned first mask layer 602 having an opening that exposes the N-type device 300B in the N-type device region 308, while the P-type device 300A in the P-type device region 304 remains protected by the patterned first mask layer 602. In various embodiments, the patterned first mask layer 602 may include a photoresist (resist) layer, an anti-reflective coating, a hard mask layer (e.g., silicon oxide, silicon nitride, silicon oxynitride, silicon carbide, or other appropriate hard mask layer), or a combination thereof. In some cases, the patterned first mask layer 602 is a first layer of a tri-layer photoresist. In one example, the patterned first mask layer 602 may include a bottom anti-reflective coating (BARC) formed over the device 300 and a resist layer formed over the BARC layer such that the patterned first mask layer 602 includes a patterned BARC layer and a patterned resist layer formed over the patterned BARC layer. In some cases, if only a resist layer is used, the deposited resist layer may be patterned (e.g., by exposure and development of the resist layer) to form the patterned first mask layer 602. Alternatively, if a BARC layer (and/or hard mask layer) is used, a pattern may be initially formed in the resist layer (e.g., by exposure and development), after which the pattern may be transferred to an underlying BARC layer (and/or hard mask layer), for example by etching, to form the patterned first mask layer 602.

The method 200 proceeds to block 208 where a first drive-in process is performed, and a second mask layer is formed. Referring to the example of FIGS. 6 and 7, in an embodiment of block 208, initially a Vt-shifting material may be formed over the first high-K dielectric layer 316 of the N-type device 300B in the N-type device region 308 exposed by the patterned first mask layer 602. In an embodiment, the Vt-shifting material includes a metal such as lanthanum (La) or a metal-oxide such as La oxide (e.g., such as $La_2O_3$). After formation of the Vt-shifting material, an anneal process may be performed, for example, at temperatures between about 600° C. to about 850° C. Due to the anneal process, atoms from the Vt-shifting material (e.g., such as lanthanum) are driven into (e.g., by diffusion) the high-K gate dielectric layer 316 (and in some cases the IL 314) to provide a Vfb-modulated high-K dielectric layer 316A. When the high-K gate dielectric layer 316 includes hafnium oxide ($HfO_x$), as one example, the Vfb-modulated high-K dielectric layer 316A may include hafnium lanthanum oxide ($HfLaO_x$). In some embodiments, the diffused atoms (e.g., La atoms) may form dipoles at an interface of the high-K gate dielectric layer 316 and the underlying IL 314. The dipoles may cause a change in work function (Vfb) and therefore a change in threshold voltage (Vt) of the N-type device 300B. Although lanthanum is used herein as an example of the Vt-shifting material, other suitable metals such as yttrium (Y) and strontium (Sr) may alternatively be used to form Vt-shifting dipoles. In some examples, after performing the anneal process (or the drive-in process), remaining portions of the Vt-shifting material disposed over the Vfb-modulated high-K dielectric layer 316A of the N-type device 300B may be removed, for example, using a suitable etching process (e.g., wet etch, dry etch, or a combination thereof).

In a further embodiment of block 208, and after perform-ing the drive-in process to provide the Vfb-modulated high-K dielectric layer 316A, a second mask layer is formed. Still referring to the example of FIGS. 6 and 7, a second mask layer 702 may be deposited over the N-type device 300B, now having the Vfb-modulated high-K dielectric layer 316A. The second mask layer 702 may be deposited in the N-type device region 308 within the opening provided by the patterned first mask layer 602. In various embodi-ments, the second mask layer 702 may include a same material as the first mask layer 602. However, in some examples, the second mask layer 702 and the first mask layer may 602 include different materials. In some cases, the second mask layer 702 may include a photoresist (resist) layer, an anti-reflective coating, a hard mask layer (e.g., silicon oxide, silicon nitride, silicon oxynitride, silicon car-bide, or other appropriate hard mask layer), or a combination thereof. In some cases, the second mask layer 702 is a second layer (or middle layer) of a tri-layer photoresist.

The method 200 proceeds to block 210 where the first and second mask layers are removed. Referring to the example of FIGS. 7 and 8, in an embodiment of block 210, the patterned first mask layer 602 and the second mask layer 702 may be removed, for example, using a suitable etching process (e.g., wet etch, dry etch, or a combination thereof). As a result, the first high-K dielectric layer 316 formed over the semiconductor channel layers (epitaxial layers 312) in the P-type device region 304 is exposed, and the Vfb-modulated high-K dielectric layer 316A formed over the semiconductor channel layers (epitaxial layers 312) in the N-type device region 308 is exposed. The formation and subsequent removal of the second mask layer 702, as described above, may be performed for different reasons and in some cases may be performed in a different order within the method 200. For instance, in some cases, the second mask layer 702 may be formed to prevent unwanted oxida-tion of the device 300 (e.g., such as of the N-type device 300B). In another embodiment, the second mask layer 702 may be formed so that subsequent simultaneous removal of the first and second mask layers 602, 702 can be performed in a uniform manner and without degradation of the under-lying first high-K dielectric layer 316, the Vfb-modulated high-K dielectric layer 316A, or the epitaxial layers 312. This may be particularly helpful when the first and second mask layers 602, 702 are formed using a same or similar material having similar etch rates. In another example, the second mask layer 702 may serve to passivate dangling bonds at the surface of the Vfb-modulated high-K dielectric layer 316A prior to removal of the first and second mask layers 602, 702. In still another example, at block 208, the Vt-shifting material may be formed over the first high-K dielectric layer 316 of the N-type device 300B, and the second mask layer 702 may be formed over the Vt-shifting material, prior to performing the drive-in process to provide the Vfb-modulated high-K dielectric layer 316A. Thereafter, the anneal process (drive-in process) may be performed to provide the Vfb-modulated high-K dielectric layer 316A. Afterwards, in an embodiment of block 210, the patterned first mask layer 602, the second mask layer 702, and remaining portions of the Vt-shifting material may be removed, for example, using a suitable etching process (e.g., wet etch, dry etch, or a combination thereof) to expose the first high-K dielectric layer 316 formed over the semicon-ductor channel layers (epitaxial layers 312) in the P-type device region 304 and the Vfb-modulated high-K dielectric layer 316A formed over the semiconductor channel layers (epitaxial layers 312) in the N-type device region 308.

The method 200 proceeds to block 212 where a third mask layer is formed. Referring to the example of FIGS. 8 and 9, in an embodiment of block 212, a third mask layer may be deposited and patterned to form a patterned third mask layer 902 having an opening that exposes the P-type device 300A in the P-type device region 304, while the N-type device 300B in the N-type device region 308 remains protected by the patterned third mask layer 902. In various embodiments, the patterned third mask layer 902 may include a photoresist (resist) layer, an anti-reflective coating, a hard mask layer (e.g., silicon oxide, silicon nitride, silicon oxynitride, silicon carbide, or other appropriate hard mask layer), or a combi-nation thereof. In some cases, the patterned third mask layer 902 is a first layer of a tri-layer photoresist. In one example, the patterned third mask layer 902 may include a BARC layer formed over the device 300 and a resist layer formed over the BARC layer such that the patterned third mask layer 902 includes a patterned BARC layer and a patterned resist layer formed over the patterned BARC layer. In some cases, if only a resist layer is used, the deposited resist layer may be patterned (e.g., by exposure and development of the resist layer) to form the patterned third mask layer 902. Alterna-tively, if a BARC layer (and/or hard mask layer) is used, a pattern may be initially formed in the resist layer (e.g., by exposure and development), after which the pattern may be transferred to an underlying BARC layer (and/or hard mask layer), for example by etching, to form the patterned third mask layer 902.

Figures 9, 9A, 9B:
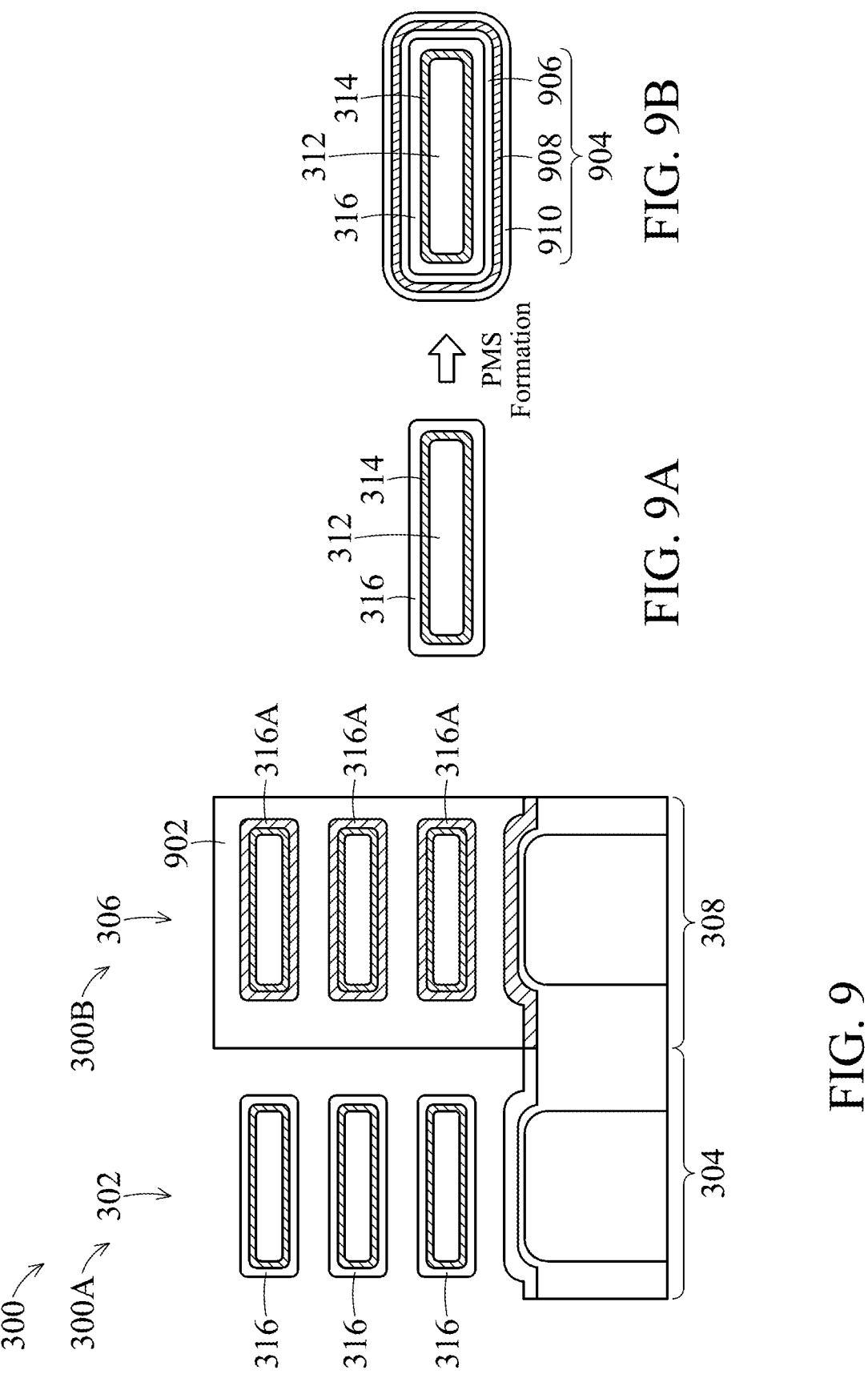
FIGS. 9A and 9B illustrate an exemplary semiconductor channel layer before and after formation of a P-type metal film stack (PMS), according to some embodiments.
Figures 10, 11:
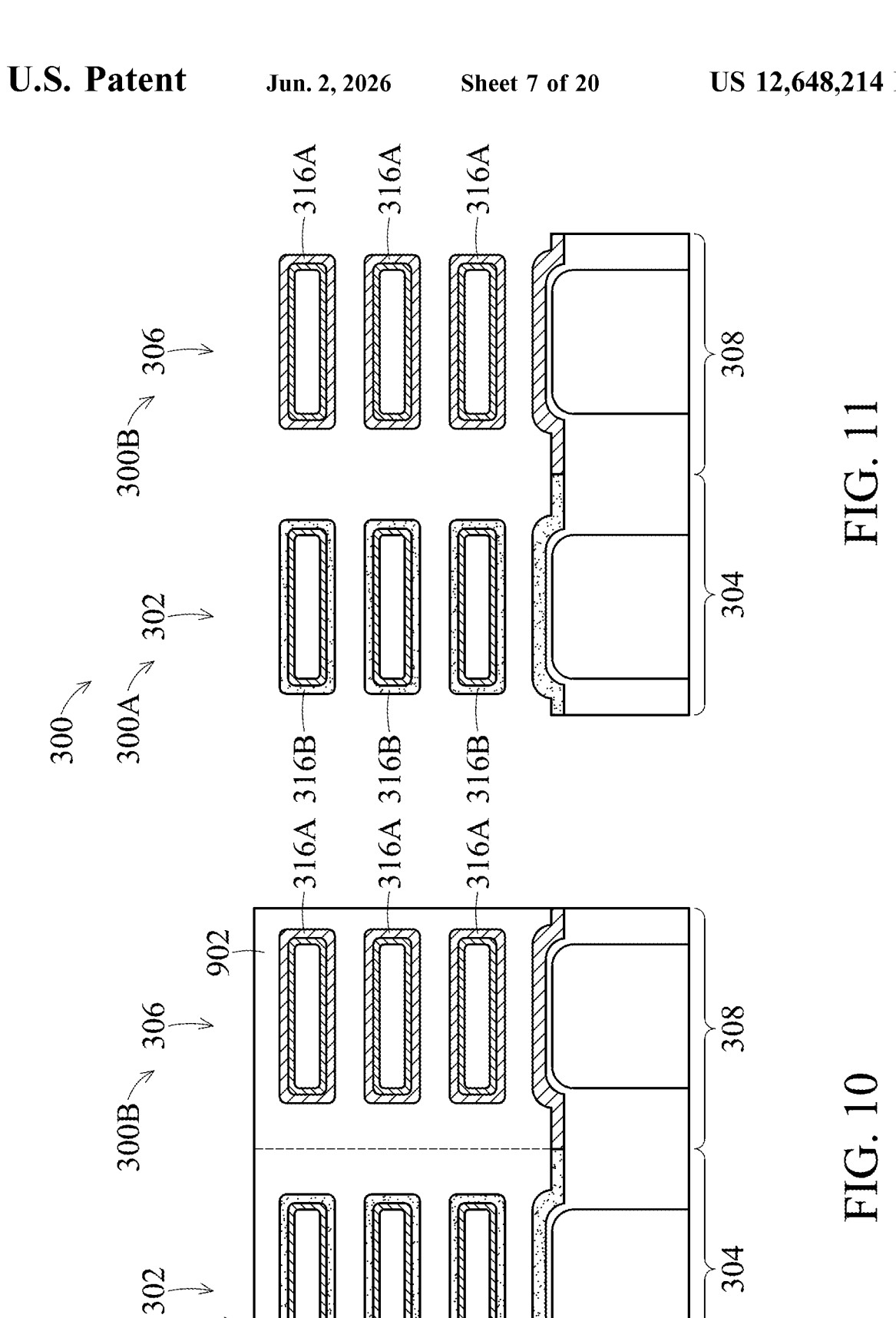

The method 200 proceeds to block 214 where a second drive-in process is performed, and a fourth mask layer is formed. Referring to the example of FIGS. 9 and 10, in an embodiment of block 214, initially a P-type metal film stack (PMS) may be formed over the first high-K dielectric layer 316 of the P-type device 300A in the P-type device region 304 exposed by the patterned third mask layer 902. In an embodiment, the PMS includes at least one of Al, Ti, or N. By way of example, FIGS. 9A and 9B illustrate an exem-plary semiconductor channel layer (epitaxial layer 312) before and after formation of the PMS. In the illustrated embodiment, a PMS 904 is formed over the first high-K dielectric layer 316. The PMS 904 may include a plurality of layers including a first PMS layer 906 formed over the first high-K dielectric layer 316, a second PMS layer 908 formed over the first PMS layer 906, and a third PMS layer 910 formed over the second PMS layer 908. In various embodi-ments, one or more of the first PMS layer 906, the second PMS layer 908, and the third PMS layer 910 include Al, Ti, or N (e.g., such as AlN, TiAlN, or other suitable composi-tion). As merely one example, the first PMS layer 906 may include an AlN layer having a thickness of between about 1-5 Angstroms, the second PMS layer 908 may include a TiAlN layer having a thickness of between about 3-15 Angstroms, and the third PMS layer 910 may include an AlN layer having a thickness of between about 10-30 Angstroms. Thus, in some cases, the second PMS layer 908 has a greater thickness than the first PMS layer 906, and the third PMS layer 910 has a greater thickness than the second PMS layer 908. The above example is not meant to be limiting, and it will be understood that each of the first, second, and third PMS layers 906, 908, 910 may have different compositions, and that the PMS 904 may include more or less than three PMS layers.

After formation of the PMS, such as the PMS 904, an anneal process may be performed, for example, at tempera-tures between about 850° C. to about 1,500° C. and for a time in a range of about 1-300 ms. Due to the anneal process, atoms from the PMS are driven into (e.g., by diffusion) the high-K gate dielectric layer 316 (and in some cases the IL 314) to provide a Vfb-modulated high-K dielectric layer 316B. Depending on the particular composition of the PMS, the atoms diffusing from the PMS into the high-K gate dielectric layer 316 may include one or more of Al, Ti, or N. In some examples, the anneal process includes a rapid thermal anneal (RTA) process, which causes the diffusion of the one or more of the Al, Ti, or N. When the high-K gate dielectric layer 316 includes hafnium oxide (HfO$_x$), and as merely one example, the Vfb-modulated high-K dielectric layer 316B may include HfTiAlNO$_x$. In some embodiments, the diffused atoms (e.g., one or more of Al, Ti, or N atoms) may cause a change in work function (Vfb) and therefore a change in threshold voltage (Vt) of the P-type device 300A. In some examples, after performing the anneal process (or the drive-in process), remaining portions of the PMS disposed over the Vfb-modulated high-K dielectric layer 316B of the P-type device 300A may be removed, for example, using a suitable etching process (e.g., wet etch, dry etch, or a combination thereof). In accordance with embodiments of the present disclosure, the PMS drive-in process (of block 214) may thus be used to adjust the flatband voltage of the P-type device 300A, which may include a GAA transistor, so as to obtain an expected threshold voltage (Vt) of the multi-gate transistor. It is also noted that since the PMS layer is removed after the annealing process is performed, the disclosed PMS drive-in process may still be performed even in the situation that the distance between adjacent semiconductor channel layers (adjacent epitaxial layers 312) is limited (e.g., such as when the distance between adjacent epitaxial layers 312 is in a range of between about 5-15 nm).

In a further embodiment of block 214, and after performing the PMS drive-in process to provide the Vfb-modulated high-K dielectric layer 316B, a fourth mask layer is formed. Still referring to the example of FIGS. 9 and 10, a fourth mask layer 1002 may be deposited over the P-type device 300A, now having the Vfb-modulated high-K dielectric layer 316B. The fourth mask layer 1002 may be deposited in the P-type device region 304 within the opening provided by the patterned third mask layer 902. In various embodiments, the fourth mask layer 1002 may include a same material as the third mask layer 902. However, in some examples, the fourth mask layer 1002 and the third mask layer 902 may include different materials. In some cases, the fourth mask layer 1002 may include a photoresist (resist) layer, an anti-reflective coating, a hard mask layer (e.g., silicon oxide, silicon nitride, silicon oxynitride, silicon carbide, or other appropriate hard mask layer), or a combination thereof. In some cases, the fourth mask layer 1002 is a second layer (or middle layer) of a tri-layer photoresist.

The method 200 proceeds to block 216 where the third and fourth mask layers are removed. Referring to the example of FIGS. 10 and 11, in an embodiment of block 216, the patterned third mask layer 902 and the fourth mask layer 1002 may be removed, for example, using a suitable etching process (e.g., wet etch, dry etch, or a combination thereof). As a result, the Vfb-modulated high-K dielectric layer 316B formed over the semiconductor channel layers (epitaxial layers 312) in the P-type device region 304 is exposed, and the Vfb-modulated high-K dielectric layer 316A previously formed over the semiconductor channel layers (epitaxial layers 312) in the N-type device region 308 is exposed. The formation and subsequent removal of the fourth mask layer 1002, as described above, may be performed for different reasons and in some cases may be performed in a different order within the method 200. For instance, in some cases, the fourth mask layer 1002 may be formed to prevent unwanted oxidation of the device 300 (e.g., such as of the P-type device 300A). In another embodiment, the fourth mask layer 1002 may be formed so that subsequent simultaneous removal of the third and fourth mask layers 902, 1002 can be performed in a uniform manner and without degradation of the underlying Vfb-modulated high-K dielectric layer 316B, the Vfb-modulated high-K dielectric layer 316A, or the epitaxial layers 312. This may be particularly helpful when the third and fourth mask layers 902, 1002 are formed using a same or similar material having similar etch rates. In another example, the fourth mask layer 1002 may serve to passivate dangling bonds at the surface of the Vfb-modulated high-K dielectric layer 316B prior to removal of the third and fourth mask layers 902, 1002. In still another example, at block 214, the PMS may be formed over the first high-K dielectric layer 316 of the P-type device 300A, and the fourth mask layer 1002 may be formed over the PMS, prior to performing the drive-in process to provide the Vfb-modulated high-K dielectric layer 316B. Thereafter, the anneal process (drive-in process) may be performed to provide the Vfb-modulated high-K dielectric layer 316B. Afterwards, in an embodiment of block 216, the patterned third mask layer 902, the fourth mask layer 1002, and remaining portions of the PMS may be removed, for example, using a suitable etching process (e.g., wet etch, dry etch, or a combination thereof) to expose the Vfb-modulated high-K dielectric layer 316B formed over the semiconductor channel layers (epitaxial layers 312) in the P-type device region 304 and the Vfb-modulated high-K dielectric layer 316A formed over the semiconductor channel layers (epitaxial layers 312) in the N-type device region 308.

The method 200 proceeds to block 218 where a second high-K (HK) dielectric layer is formed. Referring to the examples of FIGS. 11 and 12, in an embodiment of block 218, a second high-K dielectric layer 1202 is formed on exposed surfaces of the Vfb-modulated high-K dielectric layer 316B, including wrapping around (surrounding) the Vfb-modulated high-K dielectric layer 316B disposed over the semiconductor channel layers (epitaxial layers 312) in the P-type device region 304. The second high-K dielectric layer 1202 is also simultaneously formed on exposed surfaces of the Vfb-modulated high-K dielectric layer 316A, including wrapping around (surrounding) the Vfb-modulated high-K dielectric layer 316A disposed over the semiconductor channel layers (epitaxial layers 312) in the N-type device region 308. In various embodiments, the IL 314, the Vfb-modulated high-K dielectric layer 316B, and the second high-K dielectric layer 1202 may collectively define a gate dielectric of the gate structure for the P-type device 300A. Likewise, the IL 314, the Vfb-modulated high-K dielectric layer 316A, and the second high-K dielectric layer 1202 may collectively define a gate dielectric of the gate structure for the N-type device 300B. In some embodiments, the second high-K dielectric layer 1202 has a thickness of about 0.5-1.5 nm. In some embodiments, and similar to the first high-K dielectric layer 316, the second high-K dielectric layer 1202 may include hafnium dioxide (HfO$_2$), or more generally, hafnium oxide (HfO$_x$). Alternatively, the second high-K dielectric layer 1202 may include other high-K dielectrics, such as TiO$_2$, HfZrO, Ta$_2$O$_3$, HfSiO$_4$, ZrO$_2$, ZrSiO$_2$, LaO, AlO, ZrO, TiO, Ta$_2$O$_5$, Y$_2$O$_3$, SrTiO$_3$ (STO), BaTiO$_3$ (BTO), BaZrO, HfZrO, HfLaO, HfSiO, LaSiO, AlSiO, HfTaO, HfTiO, (Ba,Sr)TiO$_3$ (BST), Al$_2$O$_3$, La$_2$O$_3$, Si$_3$N$_4$, oxynitrides (SiON), combinations thereof, or other suitable material. In various embodiments, the gate dielectric may be formed by thermal oxidation, ALD, physical vapor deposition (PVD), pulsed laser deposition (PLD), CVD, and/or other suitable methods.

The method 200 proceeds to block 220 where capping layers are formed and an annealing process is performed. Referring to the examples of FIGS. 12 and 13, in an embodiment of block 220, a first capping layer 1302 is conformally deposited over the device 300, including over both the P-type device region 304 and the N-type device region 308. In particular, the first capping layer 1302 may be deposited so that it wraps around (surrounds) the second high-K dielectric layer 1202 formed in each of the P-type device region 304 and the N-type device region 308. Formation of the first capping layer 1302 may also fill gaps 1204 between adjacent ones of the semiconductor channel layers (e.g., such that the first capping layer 1302 merges between adjacent ones of the semiconductor channel layers) in each of the P-type device region 304 and the N-type device region 308. In an example, the first capping layer 1302 may include a nitrogen-containing layer such as TiN or other suitable material. The first capping layer 1302 may be deposited by ALD, CVD, or other suitable method.

Figures 12, 13:
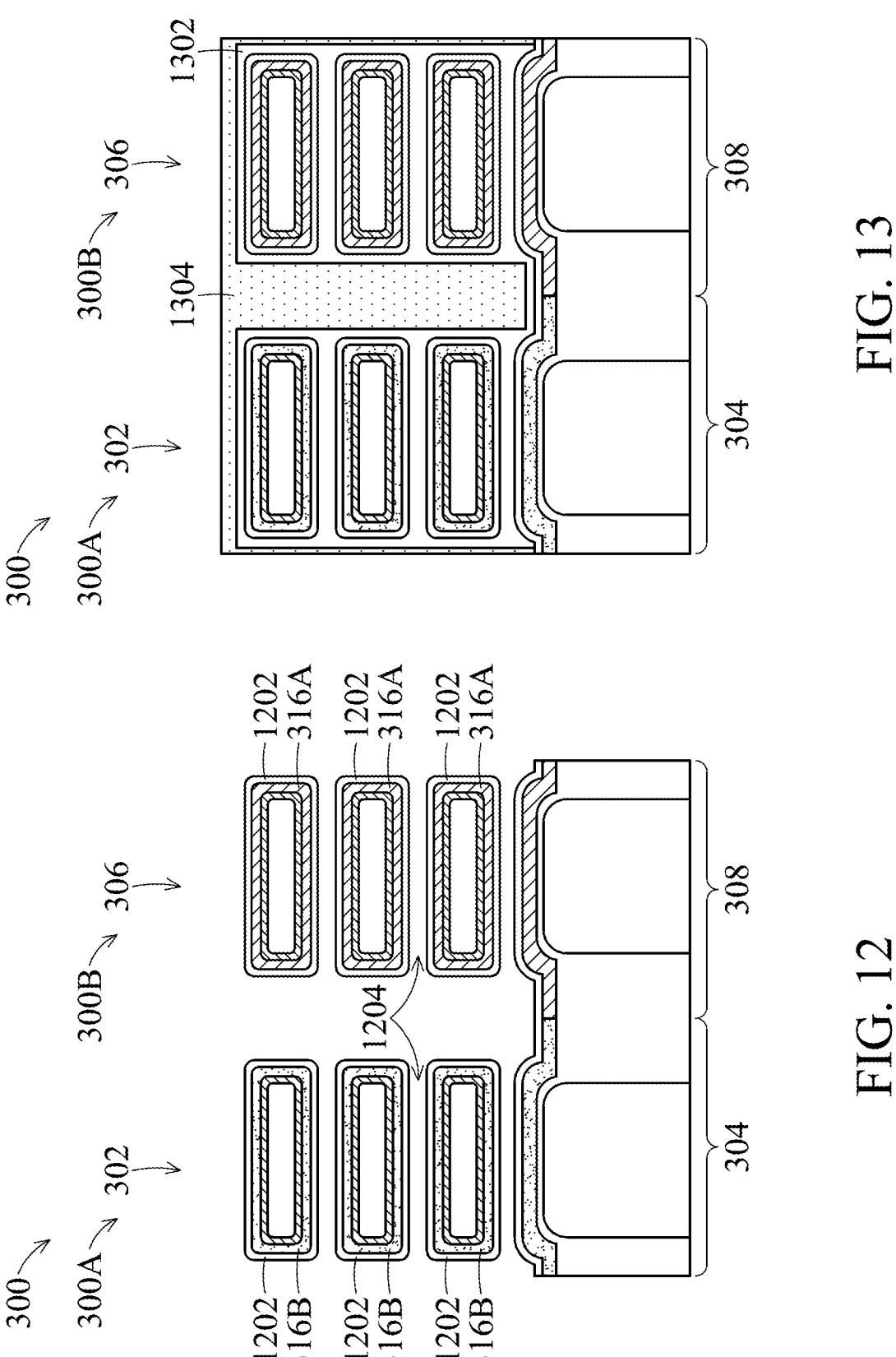
Figures 14, 15:
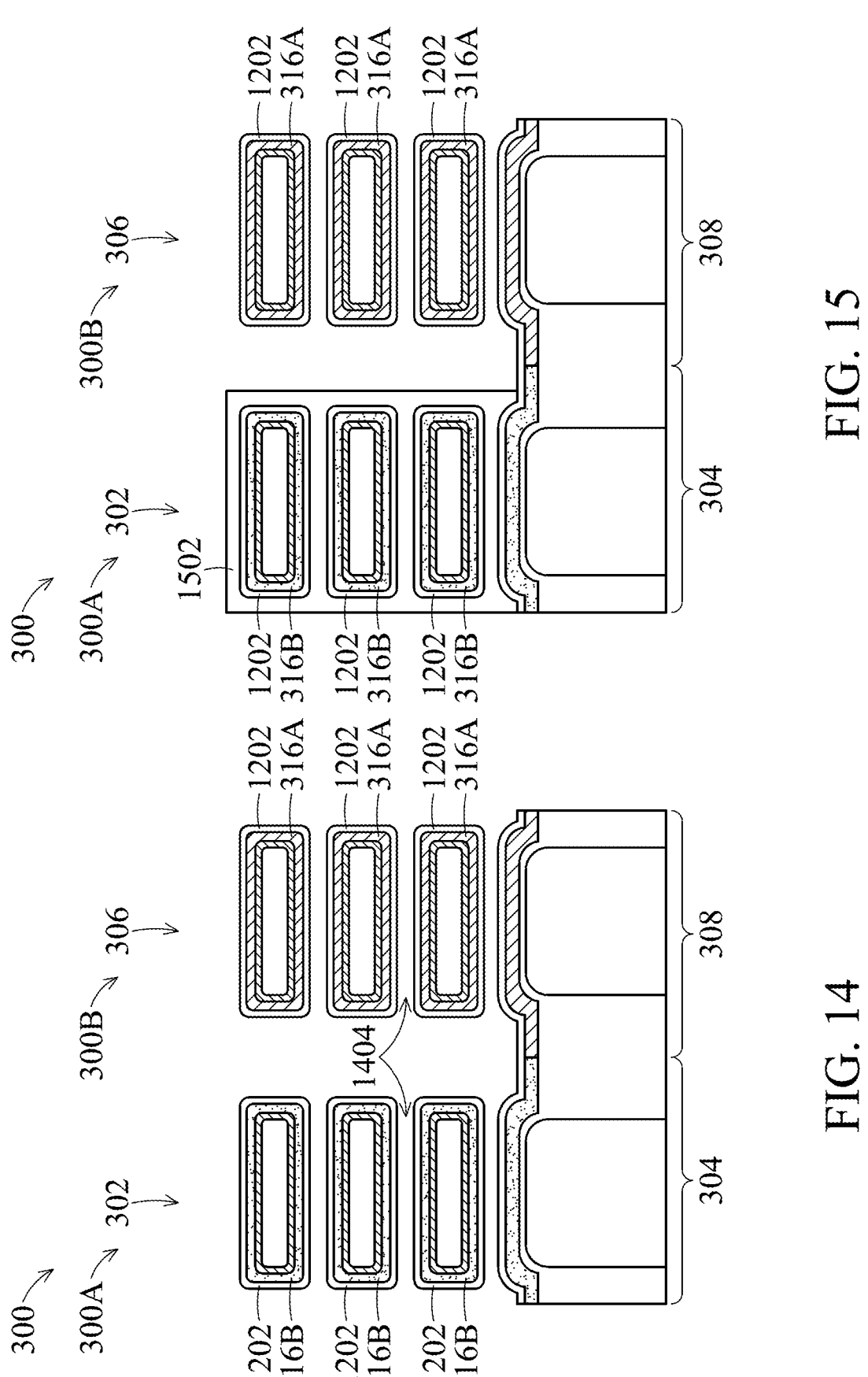

In a further embodiment of block 220, and still with reference to the examples of FIGS. 12 and 13, a second capping layer 1304 is deposited over the device 300, including over both the P-type device region 304 and the N-type device region 308. As shown in the depicted embodiment, the second capping layer 1304 may be deposited over exposed surfaces of the first capping layer 1302, including over a top surface of the fins 302, 306 of the P-type and N-type devices 300A, 300B, respectively, as well as between adjacent ones of the fins 302, 306 such that the second capping layer 1304 substantially fills the space therebetween. In an example, the second capping layer 1304 may include silicon (Si) or other suitable material. The second capping layer 1304 may be deposited by ALD, CVD, or other suitable method.

After formation of the second capping layer 1304, and in a further embodiment of block 220, an annealing process is performed to the device 300. More specifically, in some examples, the P-type and N-type devices 300A, 300B are annealed using a laser annealing process. In some embodiments, the annealing process may serve to reduce device stress and/or defects. Additionally, the annealing process may serve to further distribute the Al, Ti, and/or N atoms previously introduced into the Vfb-modulated high-K dielectric layer 316B of the P-type device 300A, including optionally into at least part of the second high-K dielectric layer 1202 formed over the Vfb-modulated high-K dielectric layer 316B. In some cases, the annealing process may also serve to further distribute the metal atoms (e.g., such as La) previously introduced into the Vfb-modulated high-K dielectric layer 316A of the N-type device 300B, including optionally into at least part of the second high-K dielectric layer 1202 formed over the Vfb-modulated high-K dielectric layer 316A. In various examples, the first capping layer 1302 (and optionally the second capping layer 1304) may serve as a barrier layer to block diffusion of the Al, Ti, and/or N from the gate dielectric of the P-type device 300A, and/or to block diffusion of the metal atoms (e.g., such as La) from the gate dielectric of the N-type device 300B during the annealing process of block 220.

The method 200 proceeds to block 222 where the capping layers are removed. Referring to the example of FIGS. 13 and 14, in an embodiment of block 222, the first capping layer 1302 and the second capping layer 1304 may be removed, for example, using a suitable etching process (e.g., wet etch, dry etch, or a combination thereof). As a result, the second high-K dielectric layer 1202, disposed on surfaces of the Vfb-modulated high-K dielectric layer 316B in the P-type device region 304 and on surfaces of the Vfb-modulated high-K dielectric layer 316A in the N-type device region 308, is exposed. It is also noted that removal of the first capping layer 1302 and the second capping layer 1304 may once again form gaps 1404, similar to the gaps 1204 discussed above, between adjacent ones of the semiconductor channel layers in each of the P-type device region 304 and the N-type device region 308.

The method 200 proceeds to block 224 where a fifth mask layer and a P-type work function metal (PWFM) layer are formed. Referring to the example of FIGS. 14 and 15, in an embodiment of block 224, a fifth mask layer may be deposited and patterned to form a patterned fifth mask layer having an opening that exposes the P-type device 300A in the P-type device region 304, while the N-type device 300B in the N-type device region 308 remains protected by the patterned fifth mask layer. In various embodiments, the patterned fifth mask layer may include a photoresist (resist) layer, an anti-reflective coating, a hard mask layer (e.g., silicon oxide, silicon nitride, silicon oxynitride, silicon carbide, or other appropriate hard mask layer), or a combination thereof. In some cases, the patterned fifth mask layer is a first layer of a tri-layer photoresist. In one example, the patterned fifth mask layer may include a BARC layer formed over the device 300 and a resist layer formed over the BARC layer such that the patterned fifth mask layer includes a patterned BARC layer and a patterned resist layer formed over the patterned BARC layer. In some cases, if only a resist layer is used, the deposited resist layer may be patterned (e.g., by exposure and development of the resist layer) to form the patterned fifth mask layer. Alternatively, if a BARC layer (and/or hard mask layer) is used, a pattern may be initially formed in the resist layer (e.g., by exposure and development), after which the pattern may be transferred to an underlying BARC layer (and/or hard mask layer), for example by etching, to form the patterned fifth mask layer.

After formation of the patterned fifth mask layer, in a further embodiment of block 224, a PWFM layer 1502 is conformally deposited over the P-type device region 304. In particular, the PWFM layer 1502 may be deposited so that it wraps around (surrounds) the second high-K dielectric layer 1202 formed in the P-type device region 304. Formation of the PWFM layer 1502 may also fill the gaps 1404 between adjacent ones of the semiconductor channel layers (e.g., such that the PWFM layer 1502 merges between adjacent ones of the semiconductor channel layers) in the P-type device region 304. In an example, the PWFM layer 1502 may include TaN, TiN, a combination thereof, or other suitable material. The PWFM layer 1502 may be deposited by ALD, CVD, or other suitable method. It is noted that a "WF metal layer", such as the PWFM layer 1502 or an NWFM layer 1602 (discussed below), may be used to describe one or more layers which are used to set a work function value for a gate electrode of a device (e.g., such as the P-type device 300A or the N-type device 300B).

After formation of the PWFM layer 1502, and in a further embodiment of block 224, the patterned fifth mask layer (still covering the N-type device 300B in the N-type device region 308) is removed. In some embodiments, the patterned fifth mask layer may be removed using a suitable etching process (e.g., wet etch, dry etch, or a combination thereof). As a result, the second high-K dielectric layer 1202, disposed on surfaces of the Vfb-modulated high-K dielectric layer 316A in the N-type device region 308, is exposed.

The method 200 proceeds to block 226 where a sixth mask layer and an N-type work function metal (NWFM) layer are formed. Referring to the example of FIGS. 15 and 16, in an embodiment of block 226, a sixth mask layer may be deposited and patterned to form a patterned sixth mask layer having an opening that exposes the N-type device 300B in the N-type device region 308, while the P-type device 300A in the P-type device region 304 remains protected by the patterned sixth mask layer. In various embodiments, the patterned sixth mask layer may include a photoresist (resist) layer, an anti-reflective coating, a hard mask layer (e.g., silicon oxide, silicon nitride, silicon oxynitride, silicon carbide, or other appropriate hard mask layer), or a combination thereof. In some cases, the patterned sixth mask layer is a first layer of a tri-layer photoresist. In one example, the patterned sixth mask layer may include a BARC layer formed over the device 300 and a resist layer formed over the BARC layer such that the patterned sixth mask layer includes a patterned BARC layer and a patterned resist layer formed over the patterned BARC layer. In some cases, if only a resist layer is used, the deposited resist layer may be patterned (e.g., by exposure and development of the resist layer) to form the patterned sixth mask layer. Alternatively, if a BARC layer (and/or hard mask layer) is used, a pattern may be initially formed in the resist layer (e.g., by exposure and development), after which the pattern may be transferred to an underlying BARC layer (and/or hard mask layer), for example by etching, to form the patterned sixth mask layer.

After formation of the patterned sixth mask layer, in a further embodiment of block 226, an NWFM layer 1602 is conformally deposited over the N-type device region 308. In particular, the NWFM layer 1602 may be deposited so that it wraps around (surrounds) the second high-K dielectric layer 1202 formed in the N-type device region 308. Formation of the NWFM layer 1602 may also fill the gaps 1404 between adjacent ones of the semiconductor channel layers (e.g., such that the NWFM layer 1602 merges between adjacent ones of the semiconductor channel layers) in the N-type device region 308. In an example, the NWFM layer 1602 may include TiAl, TaAl, TiAlC, a combination thereof, or other suitable material. The NWFM layer 1602 may be deposited by ALD, CVD, or other suitable method.

After formation of the NWFM layer 1602, and in a further embodiment of block 226, the patterned sixth mask layer (still covering the P-type device 300A in the P-type device region 304) is removed. In some embodiments, the patterned sixth mask layer may be removed using a suitable etching process (e.g., wet etch, dry etch, or a combination thereof). As a result, the PWFM layer 1502, previously formed in the P-type device region 304, is exposed. Further, after removal of the patterned sixth layer, a trench 1604 may be defined between the P-type device region 304 and the N-type device region 308.

The method 200 proceeds to block 228 where a metal capping layer and isolation layer are formed. Referring to the example of FIGS. 16 and 17, in an embodiment of block 228, a metal capping layer 1702A is formed over a top surface of the PWFM layer 1502 in the P-type device region 304 and a metal capping layer 1702B is formed over a top surface of the NWFM layer 1602 in the N-type device region 308. In some examples, the metal capping layers 1702A, 1702B may include a glue layer, a fluorine-free W (FFW) layer, W, WClx, WFx, HfClx, TiFx, TaClx, TiClx, or a combination thereof, where 'x' is equal to about 1-6. In some embodiments, formation of the metal capping layers 1702A, 1702B is performed using a selective deposition process, such that the metal capping layers 1702A, 1702B are only formed on surfaces of the PWFM layer 1502 and the NWFM layer 1602. Thereafter, by way of example, an etching process (e.g., such as a wet etch, dry etch, or combination thereof) may be performed to increase a depth of the trench 1604 defined between the P-type device region 304 and the N-type device region 308, for example, by etching into the underlying STI feature 307. The etching process may also serve to remove residual material of the metal capping layers 1702A, 1702B that may have been formed within the trench 1604. In a further embodiment of block 228, an isolation layer 1704 may then be formed within the enlarged trench 1604. By way of example, the isolation layer 1704 serves to electrically isolate the P-type device 300A in the P-type device region 304 from the N-type device 300B in the N-type device region 308, as well as the metal capping layer 1702A from the metal capping layer 1702B. In some examples, the isolation layer 1704 may include a dielectric layer such as SiN, SiCN, SiOC, SiOCN, SiOx, a flowable oxide layer, or other appropriate material. The isolation layer 1704 may include, in some embodiments, a low-K dielectric layer, a high-K dielectric layer, or a combination thereof. In some examples, the isolation layer 1704 may be deposited by CVD, ALD, PVD, and/or other suitable process. In some cases, after depositing the isolation layer 1704, a CMP process may be performed to remove excess material portions and to planarize a top surface of the device 300.

The device 300 fabricated according to the method 200 may undergo further processing to form various features and regions known in the art. For example, subsequent processing may form various contacts/vias/lines and multilayers interconnect features (e.g., metal layers and interlayer dielectrics) on the substrate including the device 300, configured to connect the various features to form a functional circuit that may include one or more devices (e.g., one or more of the P-type device 300A and the N-type device 300B). In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 200, and some process steps described above may be replaced or eliminated in accordance with various embodiments of the method 200.

Figures 18, 19:
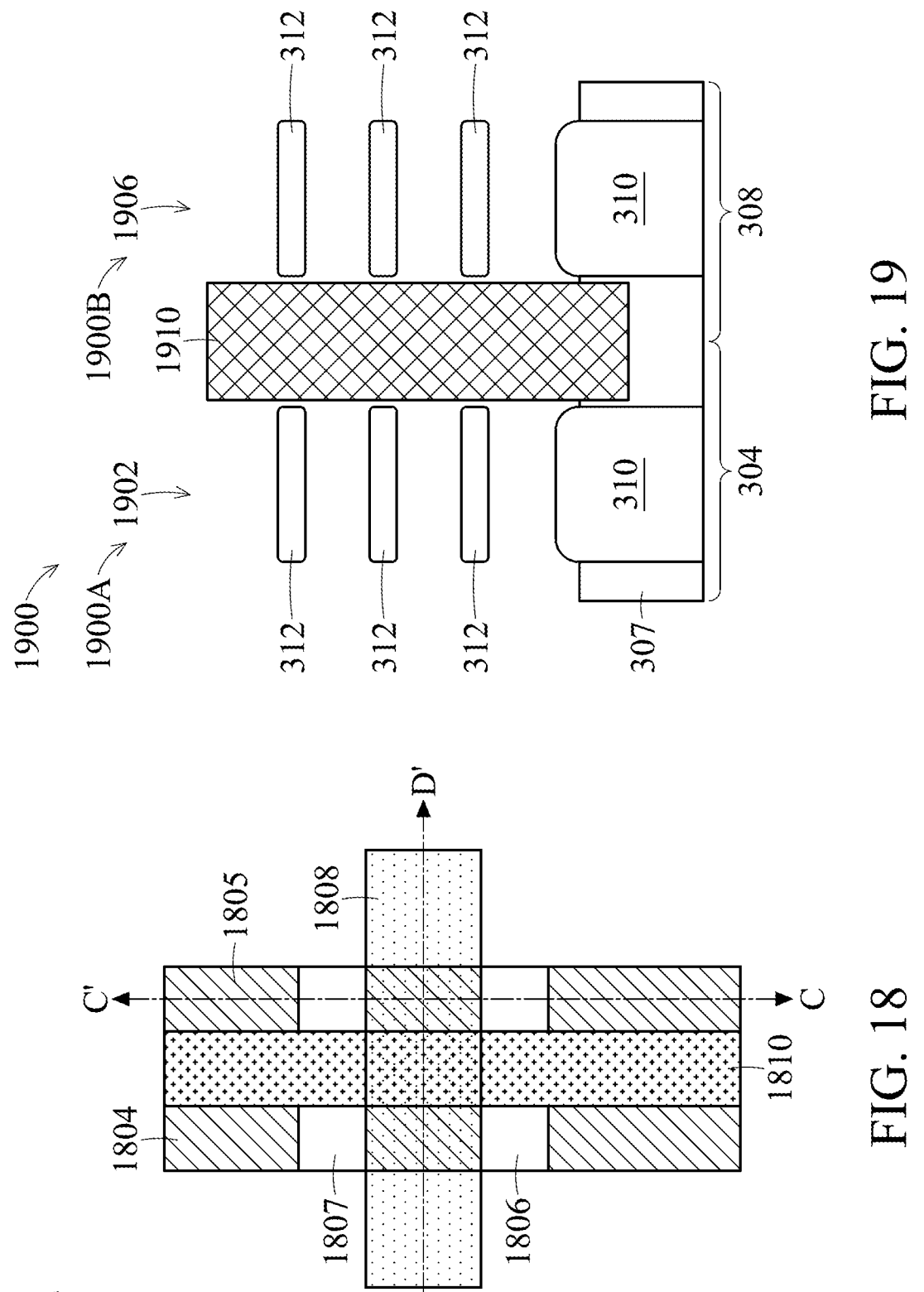
FIG. 18 provides a simplified top-down layout view of a multi-gate device, such as a forksheet transistor, in accordance with some embodiments.
FIGS. 19, 20, 21, 22, 23, 24, 25, 26, 27, 28, 29, 30, 31, 32, and 33 provide cross-sectional views of an embodiment of a semiconductor device (e.g., such as a forksheet device) along a plane substantially parallel to a plane defined by section DD' of FIG. 18, at different stages of processing according to the method of FIG. 2, in accordance with some embodiments.
Figures 20, 21:
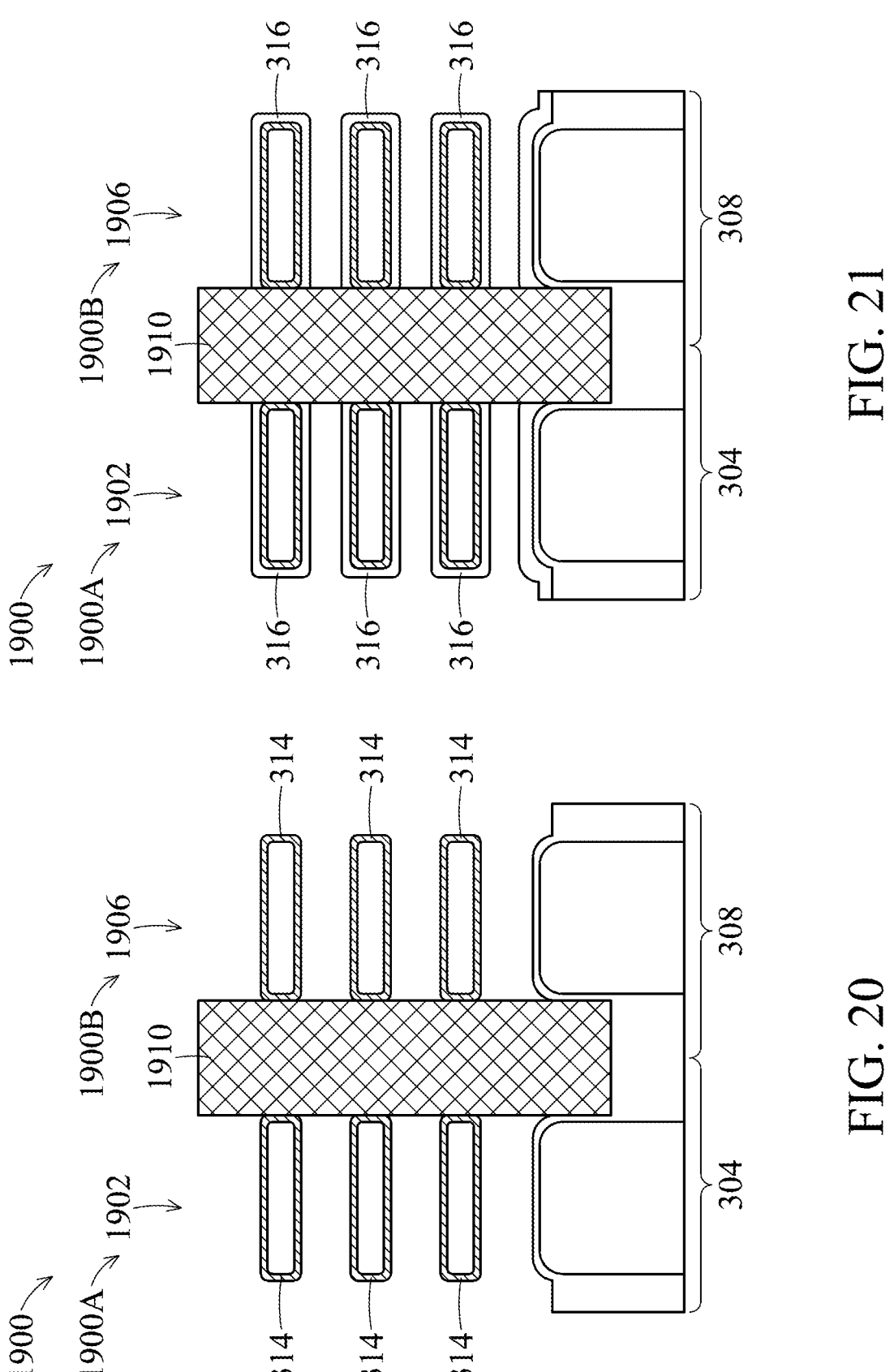
Figures 22, 23:
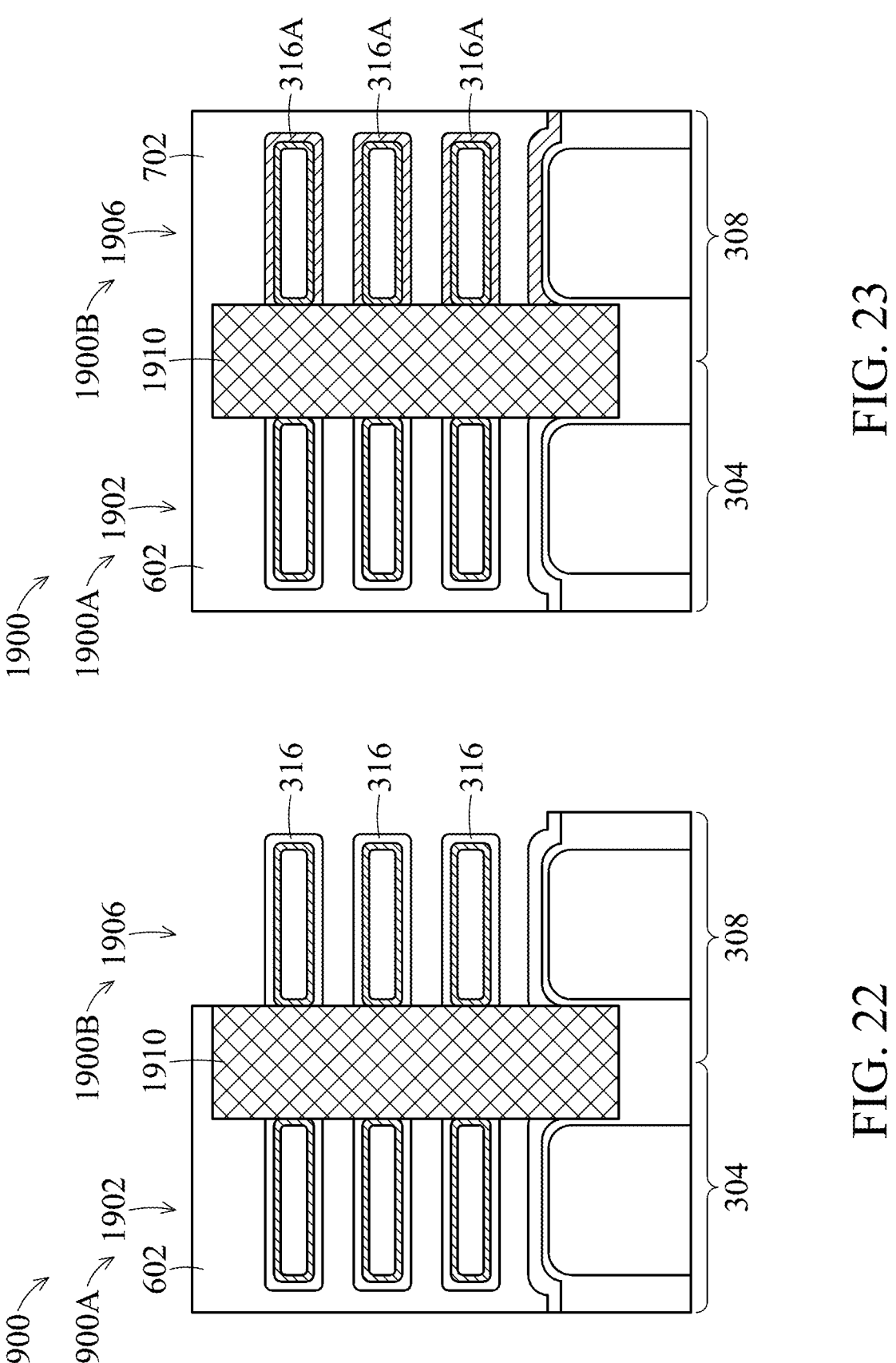
Figures 24, 25:
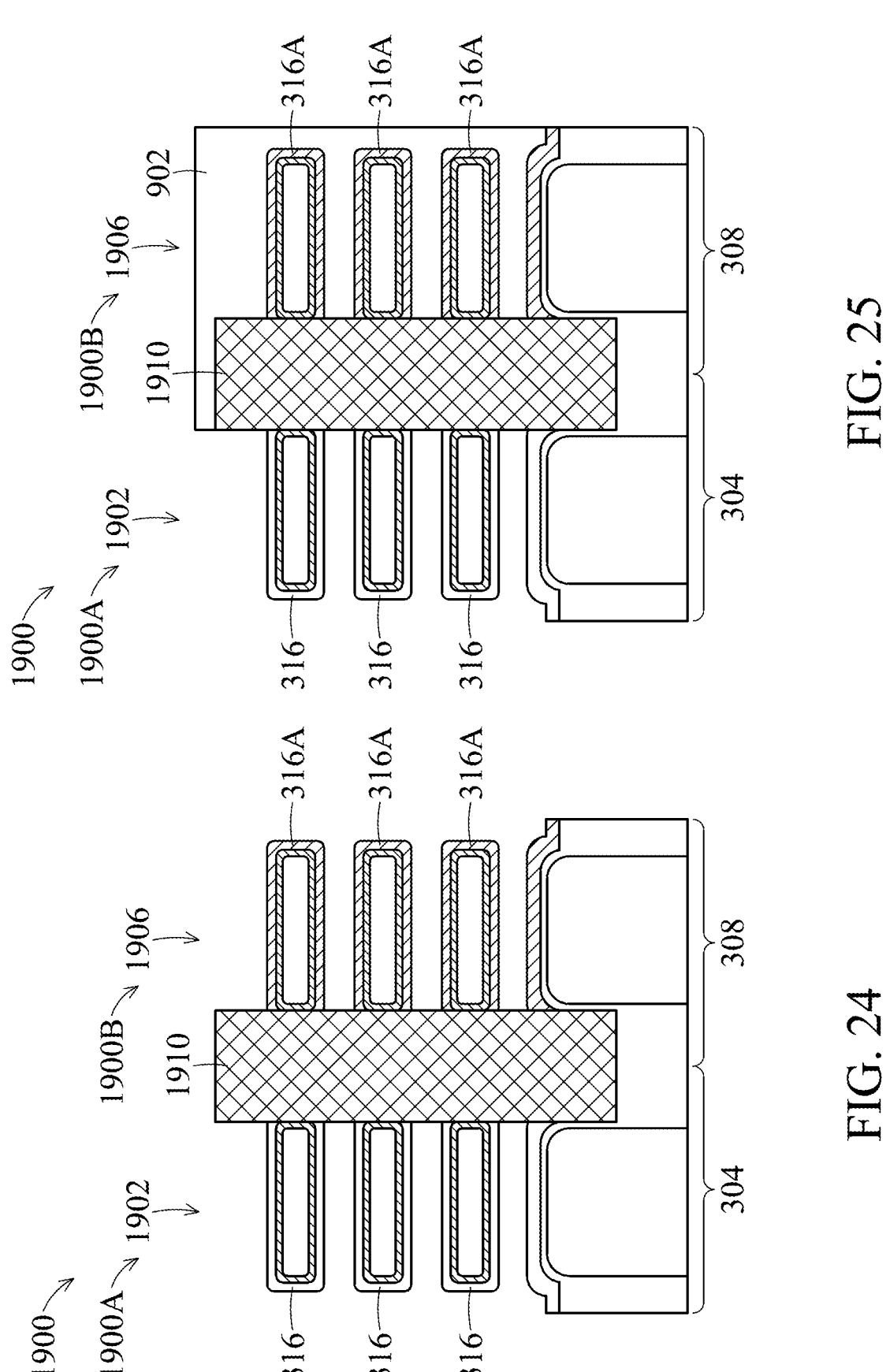
Figures 26, 27:
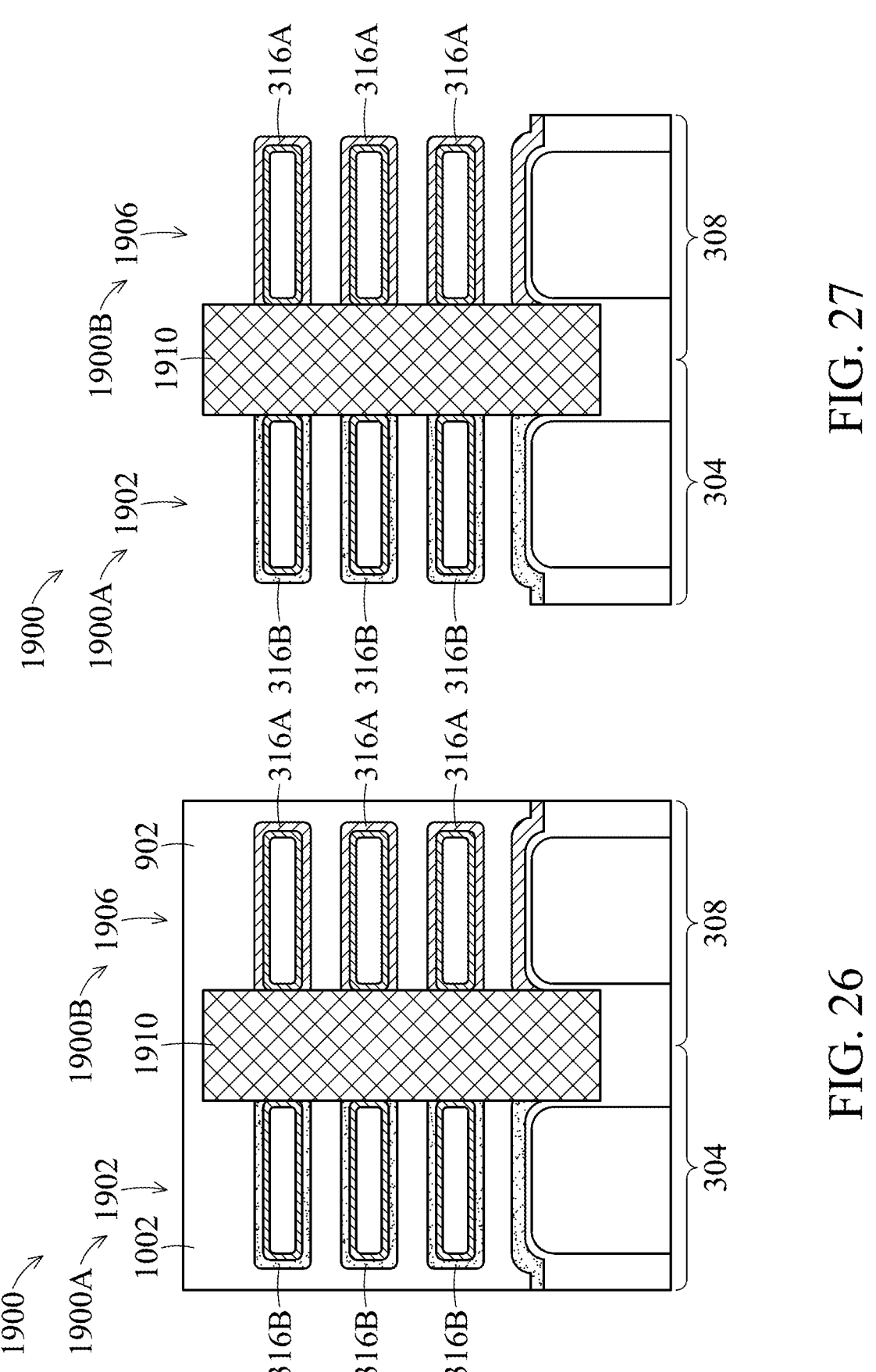

Proceeding now to forksheet transistor implementations of the method 200, reference is initially made to FIG. 18, which provides a simplified top-down layout view of a multi-gate device 1800. In various embodiments, the multi-gate device 1800 may include a forksheet transistor. The multi-gate device 1800 may include a plurality of fin elements 1804, 1805 extending from a substrate and separated by a dielectric wall 1810. In some examples, the fin element 1804 corresponds to a first device type (e.g., a P-type device) and the fin element 1805 corresponds to a second device type (e.g., an N-type device), where the dielectric wall 1810 separates the first device type from the second device type. The dielectric wall 1810 may further separate a given active region into two separate portions, a first portion which includes the first device type and a second portion which includes the second device type. Stated another way, the fin elements 1804, 1805 may both be formed on the same active region but are separated by the dielectric wall 1810. The multi-gate device 1800 further includes a gate structure 1808 disposed over and around the fin elements 1804, 1805, and source/drain features 1806, 1807 formed in source/drain regions adjacent to and on either side of the gate structure 1808, where the source/drain features 1806, 1807 are formed in, on, and/or surrounding the fins 1804, 1805. A channel region of the multi-gate device 1800, which may include a plurality of semiconductor channel layers (e.g., when the multi-gate device 1800 includes a forksheet transistor), is disposed within the fins 1804, 1805, underlying the gate structure 1808, along a plane substantially parallel to a plane defined by section CC' of FIG. 18. In some embodiments, sidewall spacers may also be formed on sidewalls of the gate structure 1808.

As previously noted, the method 200 of FIG. 2, in some alternative embodiments, may be used for fabrication of a semiconductor device 1900 which includes forksheet transistors. Thus, with respect to forksheet transistor implementations, the method 200 is now discussed with reference to FIGS. 19-33, which provide cross-sectional views of an embodiment of the semiconductor device 1900 along a plane substantially parallel to a plane defined by section DD' of FIG. 18 (e.g., along the direction of the gate structure 1808). In some embodiments, the method 200 may be used to fabricate the multi-gate device 1800, described above with reference to FIG. 18. Thus, one or more aspects discussed above with reference to the multi-gate device 1800 may also apply to the method 200. In addition, as there is significant overlap between GAA transistor implementations and forksheet transistor implementations of the method 200, the discussion of the forksheet transistor implementations discussed with reference to FIGS. 19-33 will focus on those aspects that are different from those previously discussed in reference to the GAA transistor implementations. It is also noted that, for the sake of clarity and unless otherwise indicated, like reference numerals used in the discussion of FIGS. 19-33 may refer to like features as previously discussed with reference to FIGS. 3-17.

The method 200 begins at block 202 where a substrate including a partially fabricated device is provided. Referring to the example of FIG. 19, in an embodiment of block 202, a partially fabricated device 1900 is provided. The device 1900 is formed on a substrate, and the substrate may include silicon or other suitable substrate, and/or include other features, as previously described.

As shown in FIG. 19, the device 1900 includes a P-type device 1900A formed in a P-type device region 304 and an N-type device 1900B formed in an N-type device region 308. As shown, the P-type device region 304 and the N-type device region 308, and thus the P-type device 1900A and an N-type device 1900B, are separated and electrically isolated by a dielectric wall 1910. In various embodiments, each of the P-type device 1900A and the N-type device 1900B include a partially fabricated forksheet transistor having a plurality of channels disposed in semiconductor channel layers. Specifically, in some examples, the P-type device 1900A includes a fin 1902 extending from the substrate and the N-type device 1900B includes a fin 1906 extending from the substrate. In some cases, STI features 307 may be formed to isolate the active region including the fins 1902, 1906 from other neighboring active regions. In some embodiments, each of the fins 1902, 1906 may include a substrate portion 310 (formed from the substrate) and a plurality of epitaxial layers 312, where the epitaxial layers 312 include semiconductor channel layers. In an embodiment, the epitaxial layers 312 include silicon (Si).

The dielectric wall 1910 may include a dielectric material such as SiO₂, SiON, SiN, carbon-doped SiN, or other appropriate dielectric material, and the dielectric wall 1910 may be formed by ALD, CVD, PVD, or other suitable method. In some embodiments, a spacing between the semiconductor channel layers (epitaxial layers 312) of the P-type device 1900A and the N-type device 1900B is substantially equal to a width of the dielectric wall 1910. However, in some cases, there may be a slight separation between the dielectric wall 1910 and each of the semiconductor channel layers (epitaxial layers 312) of the P-type device 1900A and the N-type device 1900B (e.g., such as due to a liner layer disposed on the fins 1902, 1906 prior to formation of the dielectric wall 1910).

In various embodiments, the fins 1902, 1906 and their respective semiconductor channel layers (the epitaxial layer 312) may be formed by growing an epitaxial layer stack of layers of a first composition interposed by layers of a second composition. The layers of the first composition may include the semiconductor channel layers (the epitaxial layer 312, which may include Si), and the layers of the second composition may include dummy layers (e.g., such as SiGe dummy layers). After forming the epitaxial stack of layers, the dielectric wall 1910 may be formed interposing, and in some cases in contact with, the fins 1902, 1906. Thereafter, a channel layer release process may be performed, where the dummy layers (e.g., SiGe dummy layers) in the channel regions of the device 1900 may be selectively removed (e.g., using a selective etching process), while the semiconductor channel layers (the epitaxial layers 312) remain unetched. It is noted that as a result of the selective removal of the dummy layers (the SiGe dummy layers), gaps are formed between the adjacent semiconductor channel layers (the epitaxial layers 312) in the channel regions of the device 1900, where the gaps may serve to expose surfaces of the epitaxial layers 312 upon which one or more layers of a gate structure will be formed. In some embodiments, after removing the dummy layers (the SiGe dummy layers), and prior to forming the portions of the gate structures, a sheet trim process (e.g., an etching process) may be performed to modify a profile of the semiconductor channel layers (e.g., the epitaxial layers 312) to achieve desired dimensions and/or desired shapes (e.g., cylindrical-shaped (e.g., nanowire), rectangular-shaped (e.g., nanobar), sheet-shaped (e.g., nanosheet), etc.) of the semiconductor channel layers. Such a sheet trim process may, in some cases, be another reason for any potential slight separation that may exist between the dielectric wall 1910 and each of the semiconductor channel layers (epitaxial layers 312) of the P-type device 1900A and the N-type device 1900B.

The method 200 proceeds to block 204 where an IL and first high-K (HK) dielectric layer are formed. Referring to the examples of FIGS. 19 and 20, in an embodiment of block 204, an IL 314 is formed on exposed surfaces of the epitaxial layers 312 (semiconductor channel layers) and the substrate portion 310, within the channel region of each of the P-type device 1900A and the N-type device 1900B. In some cases, if there is a slight separation between the dielectric wall 1910 and each of the semiconductor channel layers (epitaxial layers 312) of the P-type device 1900A and the N-type device 1900B, then the IL 314 may completely wrap around (surround) the epitaxial layers 312. In other cases, if the dielectric wall 1910 is in contact with each of the semiconductor channel layers (epitaxial layers 312) of the P-type device 1900A and the N-type device 1900B, then the IL 314 may be formed only on three sides of the epitaxial layers 312 (e.g., top side, bottom side, and lateral side of the epitaxial layer 312 not in contact with the dielectric wall 1910). In a further embodiment of block 204, and with reference to the examples of FIGS. 20 and 21, a first high-K dielectric layer 316 is then formed over the IL 314, for example, at least on three sides of the epitaxial layers 312, as noted above. In various embodiments, the IL 314 and the first high-K dielectric layer 316 may collectively define a gate dielectric, or at least part of a gate dielectric, of the gate structure for each of the P-type device 1900A and the N-type device 1900B.

The method 200 proceeds to block 206 where a first mask layer is formed. Referring to the example of FIGS. 21 and 22, in an embodiment of block 206, a first mask layer may be deposited and patterned to form a patterned first mask layer 602 having an opening that exposes the N-type device 1900B in the N-type device region 308, while the P-type device 1900A in the P-type device region 304 remains protected by the patterned first mask layer 602. In some embodiments, the patterned first mask layer 602 may also cover a top surface of the dielectric wall 1910. In various embodiments, the patterned first mask layer 602 may include a BARC layer, a hardmask layer, a resist layer, or other suitable layer as previously described.

The method 200 proceeds to block 208 where a first drive-in process is performed, and a second mask layer is formed. Referring to the example of FIGS. 22 and 23, in an embodiment of block 208, initially a Vt-shifting material may be formed over the first high-K dielectric layer 316 of the N-type device 1900B in the N-type device region 308 exposed by the patterned first mask layer 602. In an embodiment, the Vt-shifting material includes a metal such as lanthanum (La) or a metal-oxide such as La oxide (e.g., such as $La_2O_3$). After formation of the Vt-shifting material, an anneal process may be performed, and atoms from the Vt-shifting material (e.g., such as lanthanum) are driven into (e.g., by diffusion) the high-K gate dielectric layer 316 (and in some cases the IL 314) to provide a Vfb-modulated high-K dielectric layer 316A. When the high-K gate dielectric layer 316 includes hafnium oxide ($HfO_x$), as one example, the Vfb-modulated high-K dielectric layer 316A may include hafnium lanthanum oxide ($HfLaO_x$). In some examples, after performing the anneal process (or the drive-in process), remaining portions of the Vt-shifting material disposed over the Vfb-modulated high-K dielectric layer 316A of the N-type device 1900B may be removed, for example, using a suitable etching process (e.g., wet etch, dry etch, or a combination thereof).

In a further embodiment of block 208, and after performing the drive-in process to provide the Vfb-modulated high-K dielectric layer 316A, a second mask layer is formed. Still referring to the example of FIGS. 22 and 23, a second mask layer 702 may be deposited over the N-type device 1900B, now having the Vfb-modulated high-K dielectric layer 316A. The second mask layer 702 may be deposited in the N-type device region 308 within the opening provided by the patterned first mask layer 602. In various embodiments, the second mask layer 702 may include a same material as the first mask layer 602. However, in some examples, the second mask layer 702 and the first mask layer may 602 include different materials.

The method 200 proceeds to block 210 where the first and second mask layers are removed. Referring to the example of FIGS. 23 and 24, in an embodiment of block 210, the patterned first mask layer 602 and the second mask layer 702 may be removed, for example, using a suitable etching process (e.g., wet etch, dry etch, or a combination thereof). As a result, the first high-K dielectric layer 316 formed over the semiconductor channel layers (epitaxial layers 312) in the P-type device region 304 is exposed, and the Vfb-modulated high-K dielectric layer 316A formed over the semiconductor channel layers (epitaxial layers 312) in the N-type device region 308 is exposed. The formation and subsequent removal of the second mask layer 702, as described above, may be performed for different reasons and in some cases may be performed in a different order within the method 200, as discussed above.

The method 200 proceeds to block 212 where a third mask layer is formed. Referring to the example of FIGS. 24 and 25, in an embodiment of block 212, a third mask layer may be deposited and patterned to form a patterned third mask layer 902 having an opening that exposes the P-type device 1900A in the P-type device region 304, while the N-type device 1900B in the N-type device region 308 remains protected by the patterned third mask layer 902. In some embodiments, the patterned third mask layer 902 may also cover a top surface of the dielectric wall 1910. In various embodiments, the patterned third mask layer 902 may include a BARC layer, a hardmask layer, a resist layer, or other suitable layer as previously described.

The method 200 proceeds to block 214 where a second drive-in process is performed, and a fourth mask layer is formed. Referring to the example of FIGS. 25 and 26, in an embodiment of block 214, initially a P-type metal film stack (PMS) may be formed over the first high-K dielectric layer 316 of the P-type device 1900A in the P-type device region 304 exposed by the patterned third mask layer 902. In an embodiment, the PMS includes at least one of Al, Ti, or N. Additionally, in some embodiments, the PMS may include a plurality of layers such as shown in FIG. 9B, where one or more of the plurality of layers include Al, Ti, or N (e.g., such as AlN, TiAlN, or other suitable composition).

After formation of the PMS, an anneal process may be performed to drive atoms from the PMS into the high-K gate dielectric layer 316 (and in some cases the IL 314) to provide a Vfb-modulated high-K dielectric layer 316B. Depending on the particular composition of the PMS, the atoms diffusing from the PMS into the high-K gate dielectric layer 316 may include one or more of Al, Ti, or N. In some examples, the anneal process includes an RTA process, which causes the diffusion of the one or more of the Al, Ti, or N. When the high-K gate dielectric layer 316 includes hafnium oxide ($HfO_x$), and as merely one example, the Vfb-modulated high-K dielectric layer 316B may include $HfTiAlNO_x$. In some examples, after performing the anneal process (or the drive-in process), remaining portions of the PMS disposed over the Vfb-modulated high-K dielectric layer 316B of the P-type device 1900A may be removed, for example, using a suitable etching process (e.g., wet etch, dry etch, or a combination thereof). As previously discussed, since the PMS layer is removed after the annealing process is performed, the disclosed PMS drive-in process may still be performed even in the situation that the distance between adjacent semiconductor channel layers (adjacent epitaxial layers 312) is limited (e.g., such as when the distance between adjacent epitaxial layers 312 is in a range of between about 5-15 nm).

In a further embodiment of block 214, and after performing the PMS drive-in process to provide the Vfb-modulated high-K dielectric layer 316B, a fourth mask layer is formed. Still referring to the example of FIGS. 25 and 26, a fourth mask layer 1002 may be deposited over the P-type device 1900A, now having the Vfb-modulated high-K dielectric layer 316B. The fourth mask layer 1002 may be deposited in the P-type device region 304 within the opening provided by the patterned third mask layer 902. In various embodiments, the fourth mask layer 1002 may include a same material as the third mask layer 902. However, in some examples, the fourth mask layer 1002 and the third mask layer 902 may include different materials.

The method 200 proceeds to block 216 where the third and fourth mask layers are removed. Referring to the example of FIGS. 26 and 27, in an embodiment of block 216, the patterned third mask layer 902 and the fourth mask layer 1002 may be removed, for example, using a suitable etching process (e.g., wet etch, dry etch, or a combination thereof). As a result, the Vfb-modulated high-K dielectric layer 316B formed over the semiconductor channel layers (epitaxial layers 312) in the P-type device region 304 is exposed, and the Vfb-modulated high-K dielectric layer 316A previously formed over the semiconductor channel layers (epitaxial layers 312) in the N-type device region 308 is exposed. The formation and subsequent removal of the fourth mask layer 1002, as described above, may be performed for different reasons and in some cases may be performed in a different order within the method 200, as previously discussed.

The method 200 proceeds to block 218 where a second high-K (HK) dielectric layer is formed. Referring to the examples of FIGS. 27 and 28, in an embodiment of block 218, a second high-K dielectric layer 1202 is formed on exposed surfaces of the Vfb-modulated high-K dielectric layer 316B disposed over at least three sides of the semiconductor channel layers (epitaxial layers 312) in the P-type device region 304. The second high-K dielectric layer 1202 is also simultaneously formed on exposed surfaces of the Vfb-modulated high-K dielectric layer 316A disposed over at least three sides of the semiconductor channel layers (epitaxial layers 312) in the N-type device region 308. In various embodiments, the IL 314, the Vfb-modulated high-K dielectric layer 316B, and the second high-K dielectric layer 1202 may collectively define a gate dielectric of the gate structure for the P-type device 1900A. Likewise, the IL 314, the Vfb-modulated high-K dielectric layer 316A, and the second high-K dielectric layer 1202 may collectively define a gate dielectric of the gate structure for the N-type device 1900B.

The method 200 proceeds to block 220 where capping layers are formed and an annealing process is performed. Referring to the examples of FIGS. 28 and 29, in an embodiment of block 220, a first capping layer 1302 is deposited over the device 1900, including over both the P-type device region 304 and the N-type device region 308. In particular, the first capping layer 1302 may be deposited so that it covers the second high-K dielectric layer 1202 formed over at least three sides of the epitaxial layers 312 in each of the P-type device region 304 and the N-type device region 308. Formation of the first capping layer 1302 may also fill gaps between adjacent ones of the semiconductor channel layers (e.g., such that the first capping layer 1302 merges between adjacent ones of the semiconductor channel layers) in each of the P-type device region 304 and the N-type device region 308. Further, the first capping layer 1302 may be formed such that a top surface of the first capping layer 1302 in each of the P-type device region 304 and the N-type device region 308 is substantially level with a top surface of the dielectric wall 1910. This may be achieved, for example, by performing a CMP process after deposition of the first capping layer 1302 over the device 1900. In some embodiments, the first capping layer 1302 may include a nitrogen-containing layer such as TiN or other suitable material.

Figures 28, 29:
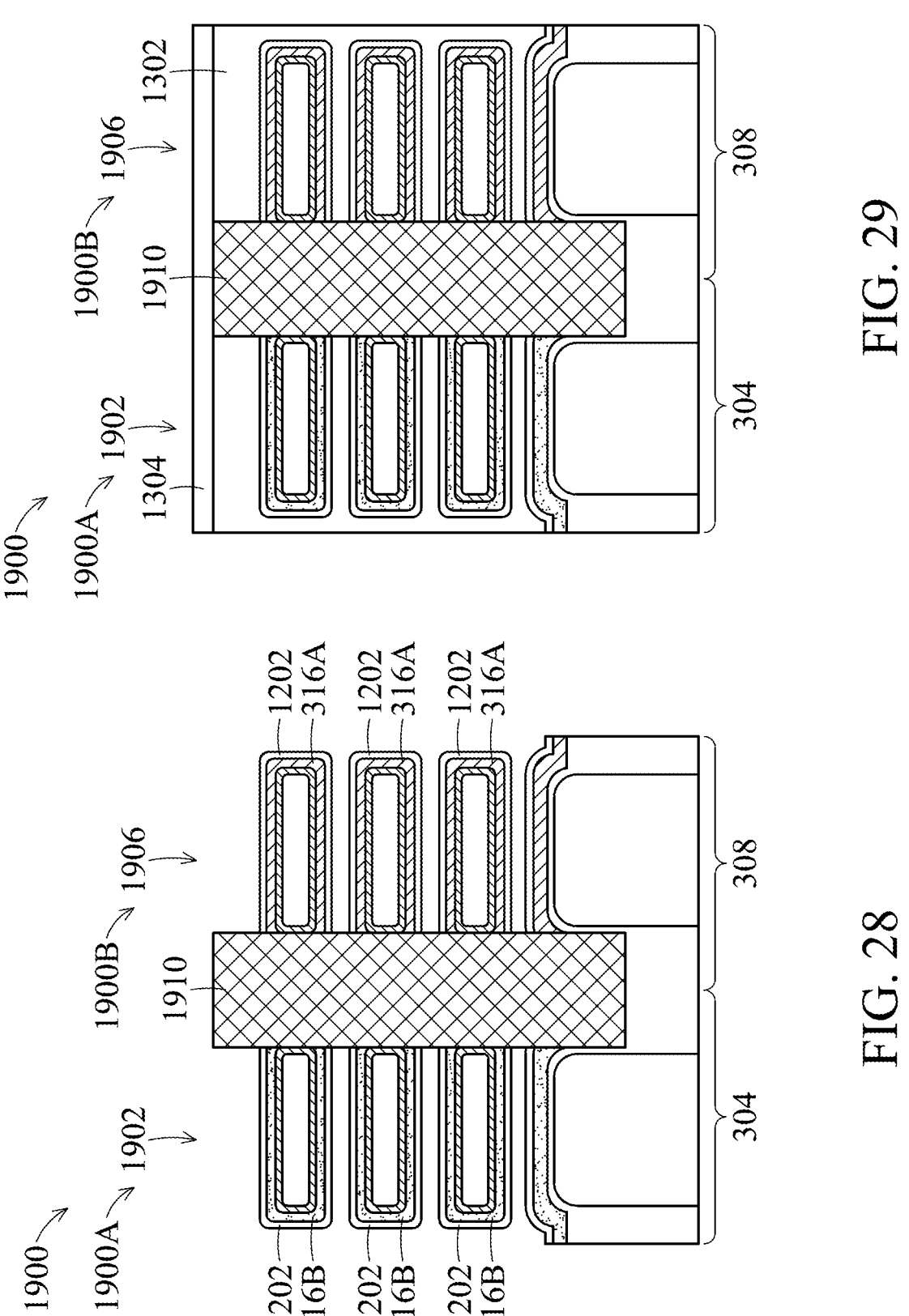
Figures 30, 31:
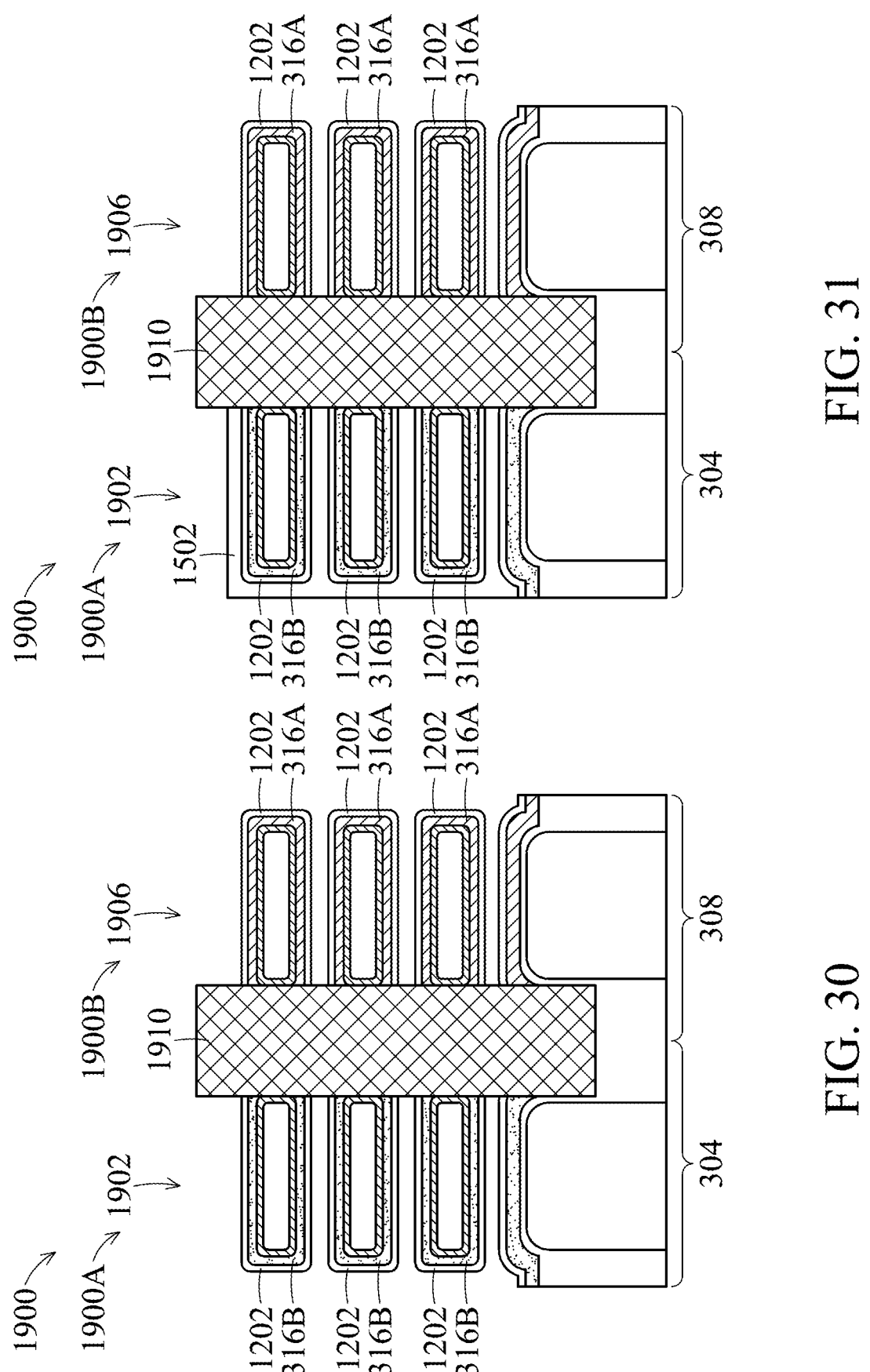

In a further embodiment of block 220, and still with reference to the examples of FIGS. 28 and 29, a second capping layer 1304 is deposited over the device 1900, including over both the P-type device region 304 and the N-type device region 308. As shown in the depicted embodiment, the second capping layer 1304 may be deposited over the level top surfaces of the first capping layer 1302 and the dielectric wall 1910. In an example, the second capping layer 1304 may include silicon (Si) or other suitable material. After formation of the second capping layer 1304, and in a further embodiment of block 220, an annealing process (e.g., such as a laser annealing process) is performed to the device 1900, as previously described.

The method 200 proceeds to block 222 where the capping layers are removed. Referring to the example of FIGS. 29 and 30, in an embodiment of block 222, the first capping layer 1302 and the second capping layer 1304 may be removed, for example, using a suitable etching process (e.g., wet etch, dry etch, or a combination thereof). As a result, the second high-K dielectric layer 1202, disposed on surfaces of the Vfb-modulated high-K dielectric layer 316B in the P-type device region 304 and on surfaces of the Vfb-modulated high-K dielectric layer 316A in the N-type device region 308, is exposed.

The method 200 proceeds to block 224 where a fifth mask layer and a P-type work function metal (PWFM) layer are formed. Referring to the example of FIGS. 30 and 31, in an embodiment of block 224, a fifth mask layer may be deposited and patterned to form a patterned fifth mask layer having an opening that exposes the P-type device 1900A, while the N-type device 1900B remains protected by the patterned fifth mask layer. In various embodiments, the patterned fifth mask layer may include a BARC layer, a hardmask layer, a resist layer, or other suitable layer as previously described.

After formation of the patterned fifth mask layer, in a further embodiment of block 224, a PWFM layer 1502 is conformally deposited over the P-type device region 304. In particular, the PWFM layer 1502 may be deposited so that it wraps around (surrounds) the second high-K dielectric layer 1202 formed over at least three sides of the epitaxial layers 312 in the P-type device region 304. In some embodiments, a top surface of the PWFM layer 1502 defines a plane that is disposed beneath another plane defined by the top surface of the dielectric wall 1910. Formation of the PWFM layer 1502 may also fill the gaps between adjacent ones of the semiconductor channel layers (e.g., such that the PWFM layer 1502 merges between adjacent ones of the semiconductor channel layers) in the P-type device region 304. After formation of the PWFM layer 1502, and in a further embodiment of block 224, the patterned fifth mask layer (still covering the N-type device 1900B) is removed. In some embodiments, the patterned fifth mask layer may be removed using a suitable etching process (e.g., wet etch, dry etch, or a combination thereof). As a result, the second high-K dielectric layer 1202, disposed on surfaces of the Vfb-modulated high-K dielectric layer 316A in the N-type device region 308, is exposed.

The method 200 proceeds to block 226 where a sixth mask layer and an N-type work function metal (NWFM) layer are formed. Referring to the example of FIGS. 31 and 32, in an embodiment of block 226, a sixth mask layer may be deposited and patterned to form a patterned sixth mask layer having an opening that exposes the N-type device 1900B, while the P-type device 300A remains protected by the patterned sixth mask layer. In various embodiments, the patterned sixth mask layer may include a BARC layer, a hardmask layer, a resist layer, or other suitable layer as previously described.

After formation of the patterned sixth mask layer, in a further embodiment of block 226, an NWFM layer 1602 is conformally deposited over the N-type device region 308. In particular, the NWFM layer 1602 may be deposited so that it wraps around (surrounds) the second high-K dielectric layer 1202 formed over at least three sides of the epitaxial layers 312 in the N-type device region 308. In some embodiments, a top surface of the NWFM layer 1602 defines a plane that is disposed beneath another plane defined by the top surface of the dielectric wall 1910. In some cases, the top surface of the NWFM layer 1602 is level with the top surface of the PWFM layer 1502. Formation of the NWFM layer 1602 may also fill the gaps between adjacent ones of the semiconductor channel layers (e.g., such that the NWFM layer 1602 merges between adjacent ones of the semiconductor channel layers) in the N-type device region 308. After formation of the NWFM layer 1602, and in a further embodiment of block 226, the patterned sixth mask layer (still covering the P-type device 1900A) is removed. In some embodiments, the patterned sixth mask layer may be removed using a suitable etching process (e.g., wet etch, dry etch, or a combination thereof). As a result, the PWFM layer 1502, previously formed in the P-type device region 304, is exposed.

The method 200 proceeds to block 228 where a metal capping layer is formed. As shown in block 228 of FIG. 2, formation of the isolation layer at this stage of processing is optional, and for the present example of a forksheet implementation the dielectric wall 1910 provides the isolation between the P-type device 1900A and the N-type device 1900B, thus another isolation layer may not be formed at block 228. Referring to the example of FIGS. 32 and 33, in an embodiment of block 228, a metal capping layer 1702A is formed over a top surface of the PWFM layer 1502 in the P-type device region 304 and a metal capping layer 1702B is formed over a top surface of the NWFM layer 1602 in the N-type device region 308. In some examples, the metal capping layers 1702A, 1702B may include a glue layer, a fluorine-free W (FFW) layer, W, WClx, WFx, HfClx, TiFx, TaClx, TiClx, or a combination thereof, where 'x' is equal to about 1-6. In the present example, the dielectric wall 1910 serves to electrically isolate the P-type device 1900A in the P-type device region 304 from the N-type device 1900B in the N-type device region 308, as well as the metal capping layer 1702A from the metal capping layer 1702B. In some examples, top surfaces of the metal capping layers 1702A, 1702B are substantially level with the top surface of the dielectric wall 1910.

The device 1900 fabricated according to the method 200 may undergo further processing to form various features and regions known in the art. For example, subsequent processing may form various contacts/vias/lines and multilayers interconnect features (e.g., metal layers and interlayer dielectrics) on the substrate including the device 1900, configured to connect the various features to form a functional circuit that may include one or more devices (e.g., one or more of the P-type device 1900A and the N-type device 1900B). In furtherance of the example, a multilayer interconnection may include vertical interconnects, such as vias or contacts, and horizontal interconnects, such as metal lines. The various interconnection features may employ various conductive materials including copper, tungsten, and/or silicide. In one example, a damascene and/or dual damascene process is used to form a copper related multilayer interconnection structure. Moreover, additional process steps may be implemented before, during, and after the method 200, and some process steps described above may be replaced or eliminated in accordance with various embodiments of the method 200.

Figure 17:
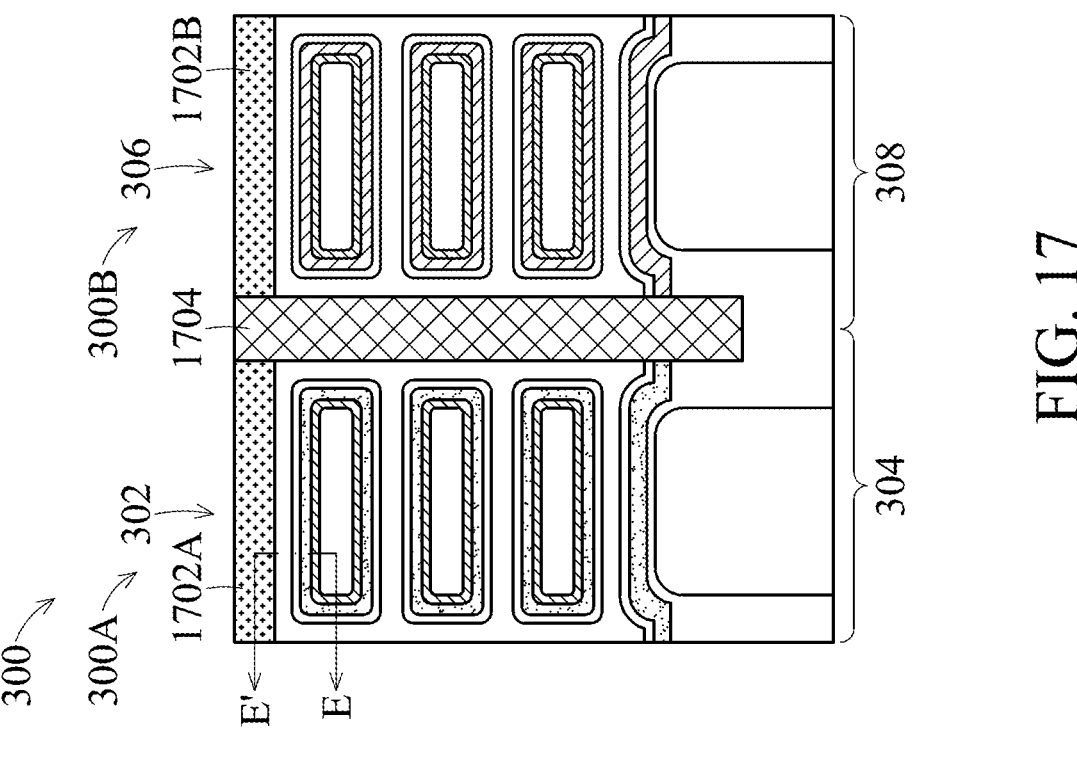
Figure 16:
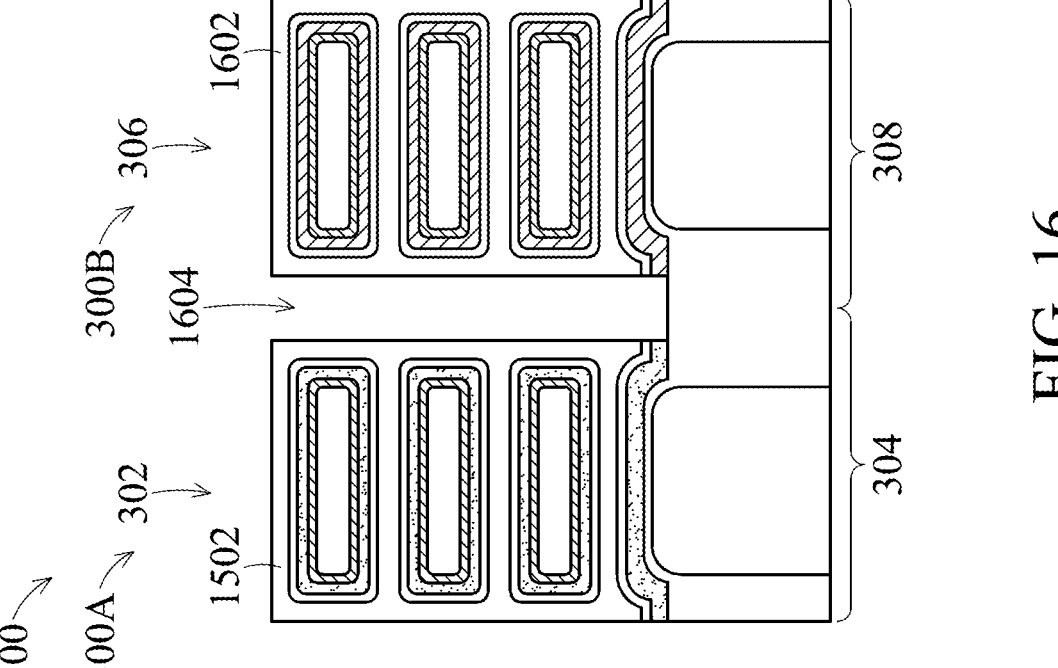
Figure 33:
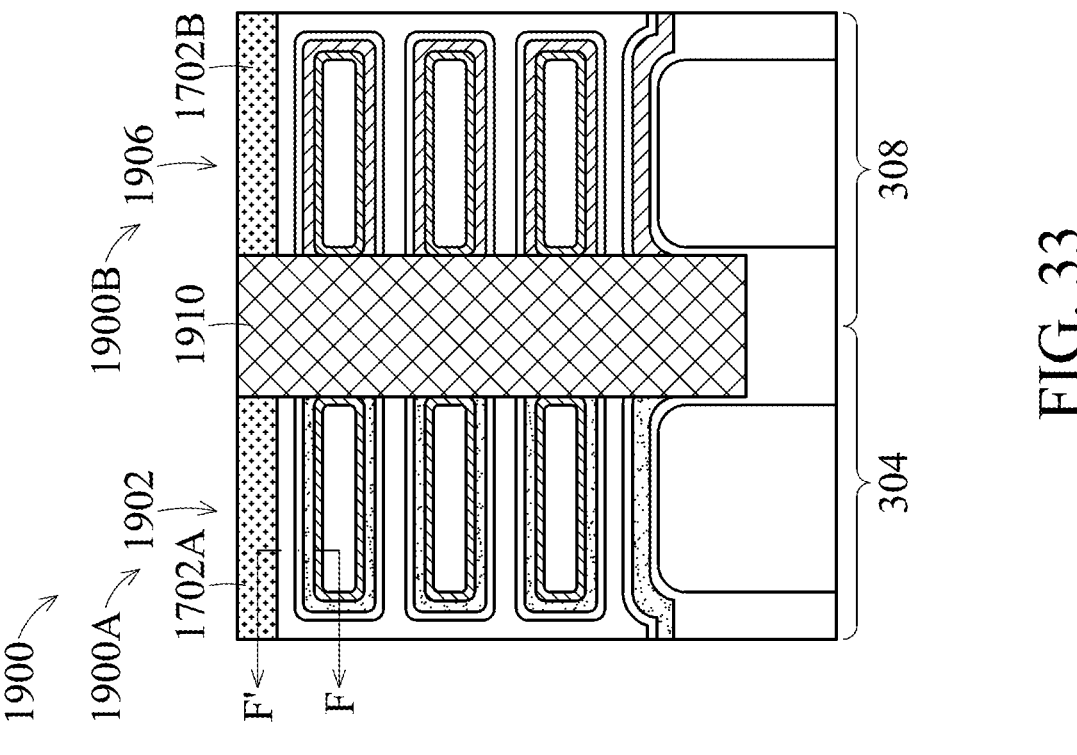
Figure 32:
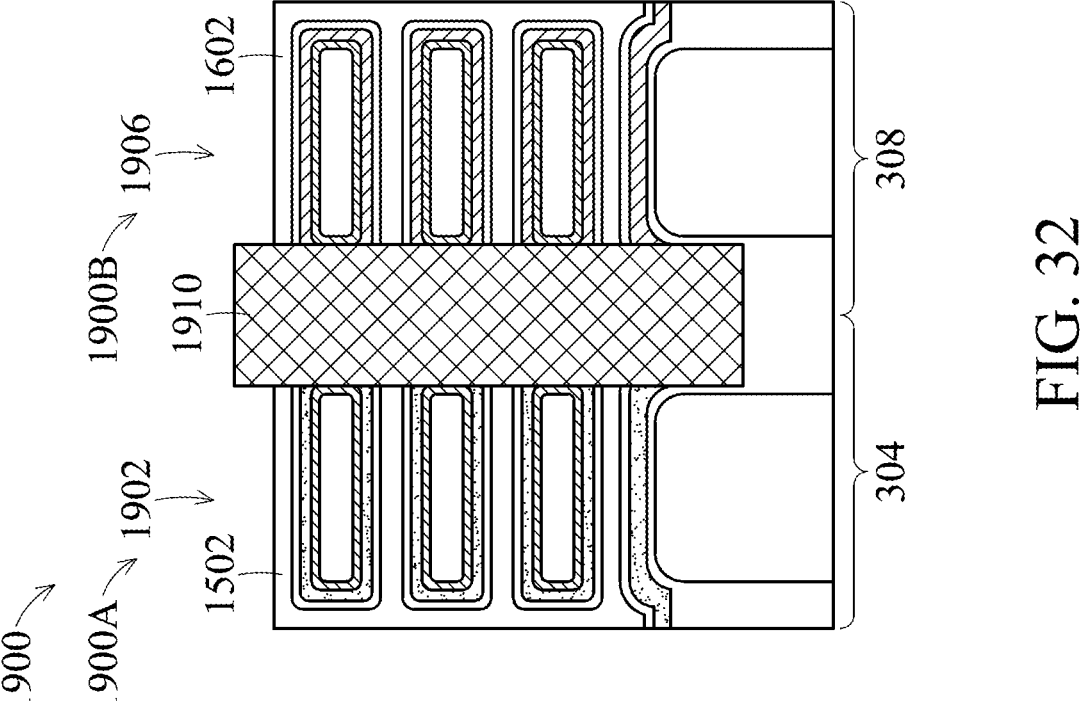
Figure 35:
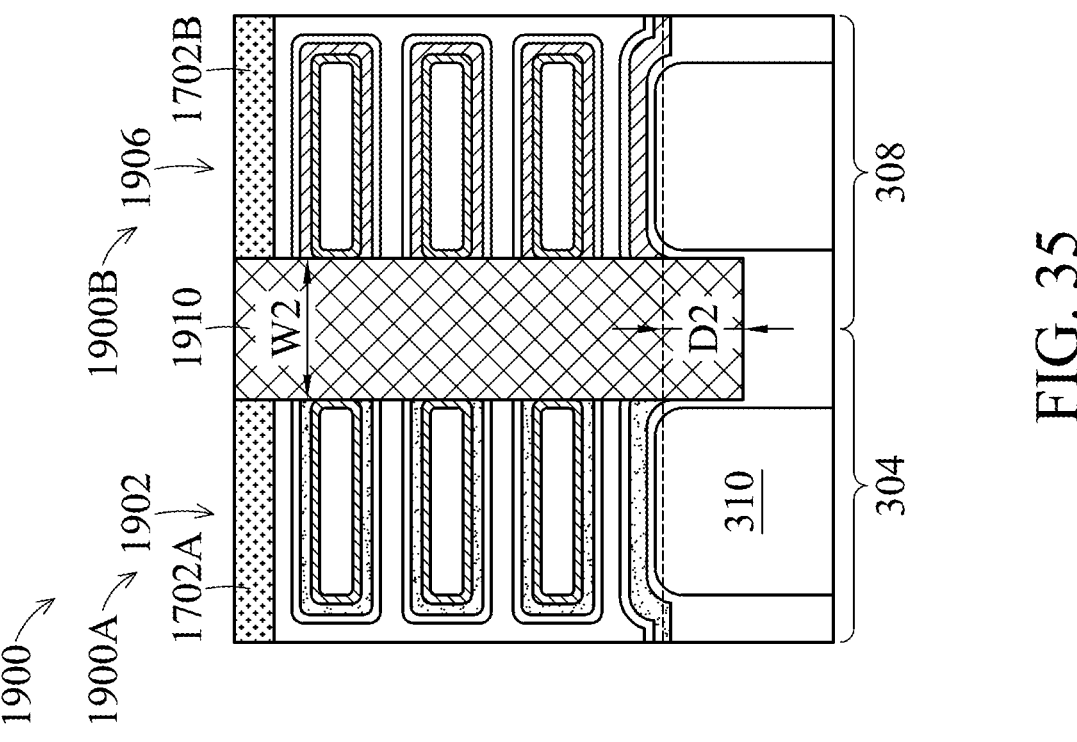
FIGS. 34 and 35 illustrate final structures of an exemplary GAA transistor and forksheet transistor, respectively, including a comparison of dimensions of the isolation features of the two devices, in accordance with some embodiments.
Figure 34:
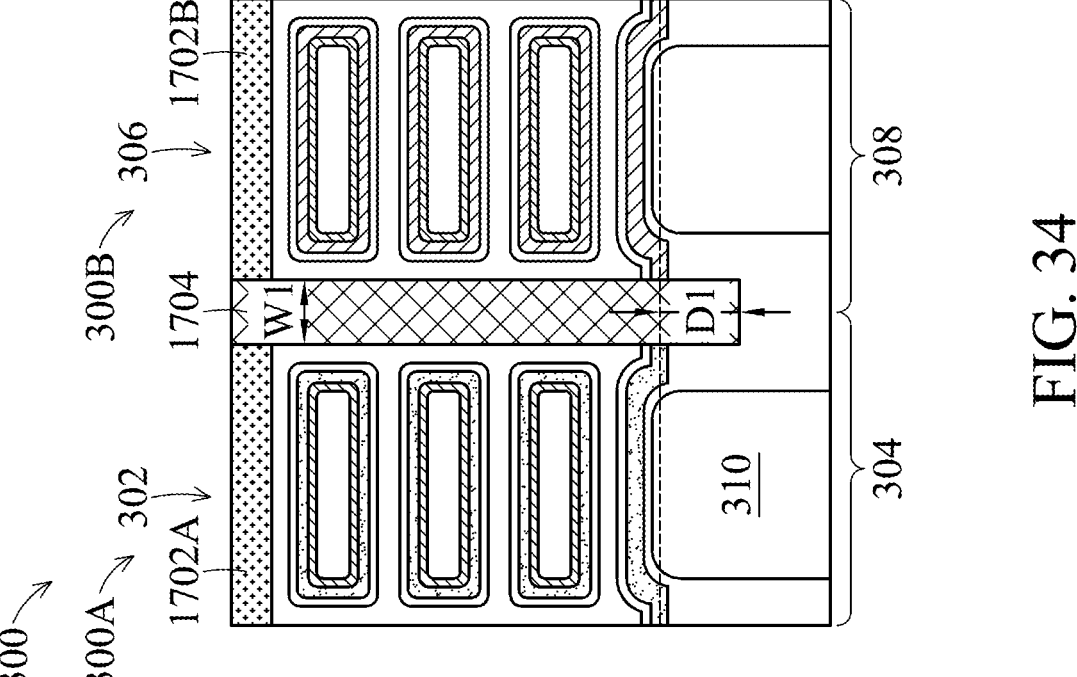

Referring to FIGS. 34, 35, illustrated therein is the GAA transistor 300 and the forksheet transistor 1900, respectively, similar to the examples shown in FIGS. 17, 33 and further including a comparison of dimensions of the isolation features of the two devices (e.g., such as the isolation layer 1704 and the dielectric wall 1910, which mitigate short circuits between adjacent P-type and N-type devices). As shown, the isolation layer 1704 of the device 300 has a width 'W1' and a bottom depth 'D1' that approximately indicates how deep the isolation layer 1704 extends below a top surface of the substrate portion 310. Similarly, the dielectric wall 1910 of the device 1900 has a width 'W2' and a bottom depth 'D2'. In some embodiments, the width W1 is in a range of between about 5-20 nm, and the width W2 is in a range of between about 8-30 nm. Generally, each of the widths W1, W2 is tunable to provide a desired isolation between the adjacent P-type and N-type devices. In some examples, the depths D1, D2 can be defined in terms of the widths W1, W2. For instance, D1 may be defined as about $4/(3*W1)$ and D2 may be defined as about $4/(3*W2)$. Thus, in some embodiments, as the depths D1, D2 and the widths W1, W2 have a generally inverse relationship. The bottom depths D1, D2 of the isolation layer 1704 and the dielectric wall 1910 are also configured to prevent parasitic capacitances at the bottommost semiconductor channel layers (epitaxial layers 312).

Figure 36:
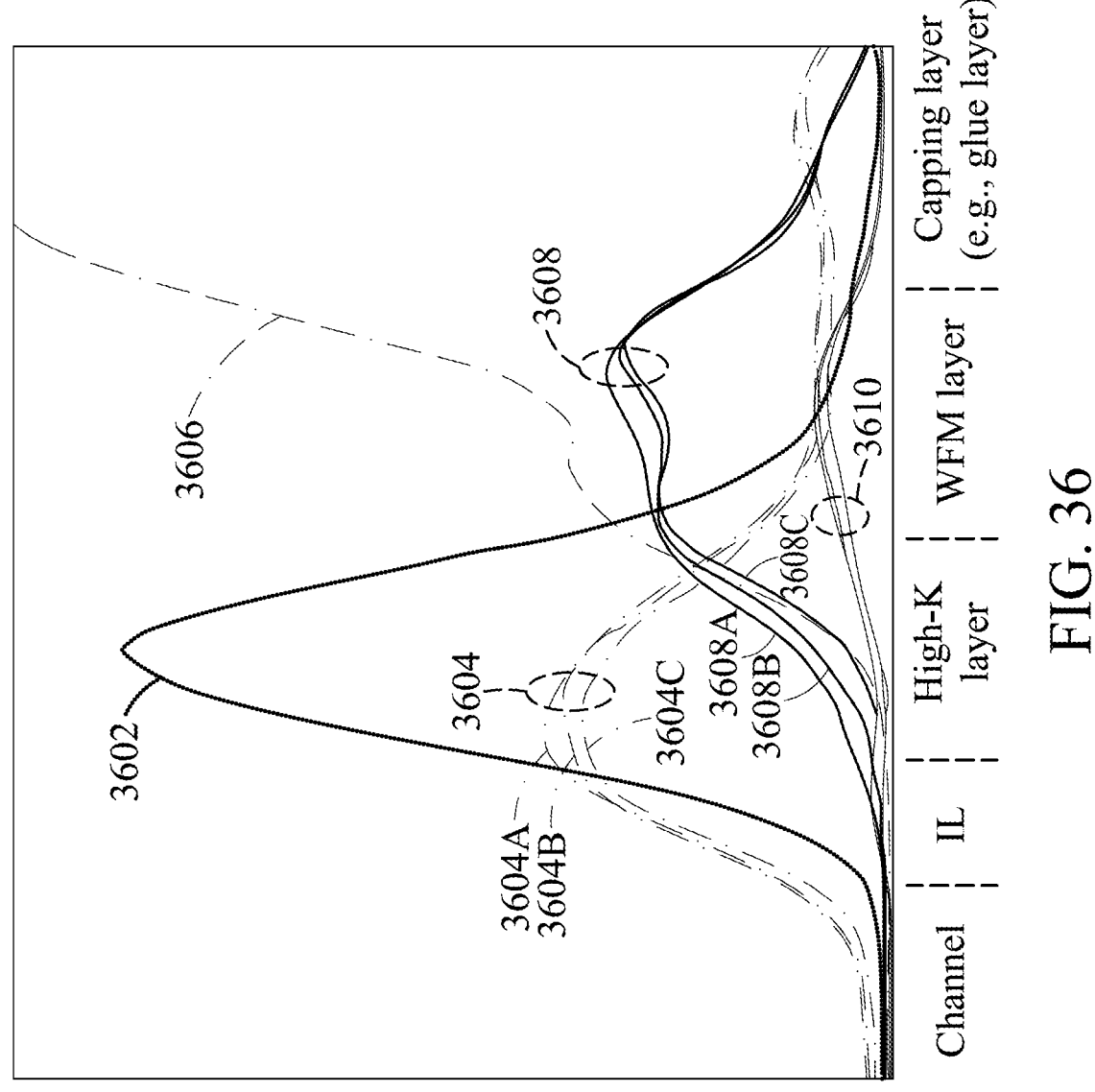
FIG. 36 illustrates a graph including concentration versus depth profiles for various elements in a P-type device resulting from the disclosed PMS drive-in process, in accordance with some embodiments.

With reference to FIG. 36, illustrated therein is a graph 3600 including concentration versus depth profiles for various elements in the P-type device (e.g., such as the P-type devices 300A, 1900A) resulting from the disclosed PMS drive-in process. In the graph 3600, the profiles may be taken along a section EE' (as shown in FIG. 17) or along a section FF' (as shown in FIG. 33), for example, proceeding from the semiconductor channel layer (epitaxial layer 312) through the interfacial layer (IL) 314, the high-K layer (including the Vfb-modulated high-K dielectric layer 316B and the second high-K dielectric layer 1202), the PWFM layer 1502, and the metal capping layer 1702A (which may include a glue layer, among other layers). In the illustrated example, the concentration versus depth profiles includes a curve 3602 representing a hafnium concentration [Hf], a set of curves 3604 representing an oxygen concentration [O], a curve 3606 representing a titanium concentration [Ti], a set of curves 3608 representing an aluminum concentration [Al], and a set of curves 3610 representing a chlorine concentration [Cl]. The set of curves 3604 further includes constituent curves 3604A, 3604B, 3604C, where the curve 3604A represents an oxygen concentration [O] for embodiments employing the disclosed PMS drive-in process, while the curves 3604B and 3604C represent the oxygen concentration [O] for two different reference processes. Similarly, the set of curves 3608 further includes constituent curves 3608A, 3608B, 3608C, where the curve 3608A represents an aluminum concentration [Al] for embodiments employing the disclosed PMS drive-in process, while the curves 3608B and 3608C represent the aluminum concentration [Al] for two different reference processes.

As shown in the graph 3600, the oxygen concentration [O] for the curve 3604A (employing the disclosed PMS drive-in process) is greater than the oxygen concentration [O] for the curves 3604B, 3604C (reference processes) in the IL and HK layer regions. For instance, in an embodiment, the curve 3604A shows a concentration that is about 1.11-1.17 times greater than the curve 3604C and about 1-1.11 times greater than the curve 3604B in the IL and HK layer regions. In the illustrated example, the peaks of the oxygen concentration [O] for the curves 3604A, 3604B, 3604C appear in the HK layer region near a boundary between the IL and HK layer regions, and are left-shifted (e.g., closer to the semiconductor channel layer) as compared to the peak of the hafnium concentration [Hf] for the curve 3602. In accordance with various embodiments, the peak of the hafnium concentration appears substantially at the center of the HK layer region, as shown by the curve 3602. In an example, the titanium concentration [Ti] for the curve 3606 is greater than zero in the HK layer and WFM layer regions, and is about zero in the IL region. In some cases, the aluminum concentration [Al] for each of the curves 3608A, 3608B, 3608C is greater than zero in the HK layer, WFM layer and capping layer regions. By way of example, the aluminum concentration [Al] for the curve 3608A (employing the disclosed PMS drive-in process) is greater than the aluminum concentration [Al] for the curves 3608B, 3608C (reference processes) in the HK layer region and in most of the WFM layer. For instance, in an embodiment, the curve 3608A shows a concentration that is about 1.08-1.33 times greater than the curve 3608C and about 1-1.23 times greater than the curve 3608B. In an example, the chlorine concentration [Cl] for each of the curves 3610 decreases along a direction from the WFM layer region to the IL region. In accordance with some examples, and for a given arbitrary unit (a.u.), the oxygen concentration [O] is between about 1.8-2K a.u. within the HK layer region, between about 0.4-1.8K a.u. within the IL, and between about 0-0.2K within the semiconductor channel layer. In some cases, and again for a given arbitrary unit (a.u.), the chlorine concentration [Cl] is between about 0.3-0.6K a.u. within the WFM layer, between about 0.05-0.4K a.u. within the HK layer region, and is equal to about zero within the semiconductor channel layer. In another example, and once again for a given arbitrary unit (a.u.), the aluminum concentration [Al] is between about 1.2-1.6K a.u. within the WFM layer, between about 0.2-1.4K a.u. within the HK layer region, and is equal to about zero within the semiconductor channel layer. In various embodiments and in addition to, or as an alternative to, the materials previously discussed, each of the IL, the HK layer, the WFM layer and the capping layer may include TiAlO, TiO, TiON, AlON, TiAlON, AlO, TiAlOCl, TiOCl, TiONCl, AlONCl, TiAlONCl, AlOCl, HfClO, HfCl, HfO, HfTiAlOCl, HfTiOCl, HfTiONCl, HfAlONCl, HfTiAlONCl, HfAlOCl, or a combinations thereof.

The various embodiments described herein offer several advantages over the existing art. It will be understood that not all advantages have been necessarily discussed herein, no particular advantage is required for all embodiments, and other embodiments may offer different advantages. As one example, embodiments discussed herein include methods and structures for modulating the threshold voltage of highly scaled P-type transistors (e.g., such as GAA transistors or forksheet transistors). In some examples, the disclosed method provides a P-type metal film stack (PMS) drive-in process to modulate the threshold voltage. For instance, in some embodiments and as a first step of the PMS drive-in process, a PMS layer is formed over a gate dielectric layer surrounding a semiconductor channel layer of a multi-gate device. The PMS film, in various cases, may include at least one of Al, Ti, or N. After forming the PMS layer, and as a second step of the PMS drive-in process, an annealing process is performed to cause the at least one of the Al, Ti, or N to diffuse into the gate dielectric layer (e.g., into a high-K layer), thereby effectively modulating the threshold voltage (Vt) of the multi-gate device. After performing the annealing process, and as a third step of the PMS drive-in process, the PMS layer is removed. Thereafter, device processing may continue. In accordance with embodiments of the present disclosure, the PMS drive-in process may thus be used to adjust the flatband voltage of a multi-gate transistor (e.g., such as a P-type GAA transistor or a P-type forksheet transistor), so as to obtain an expected threshold voltage (Vt) of the multi-gate transistor. It is also noted that since the PMS layer is removed after the annealing process is performed, the PMS drive-in process may still be performed even in the situation that the distance between adjacent semiconductor channel layers is limited. It is also noted that while embodiments of the present disclosure may be primarily discussed with reference to P-type transistors, it will be understood that the embodiments disclosed herein may in some cases be applied to N-type transistors, where such implementations can be readily deduced by one skilled in the art, for example by symmetry to the P-type device implementations discussed herein. Other embodiments and advantages will be evident to those skilled in the art upon reading the present disclosure.

Thus, one of the embodiments of the present disclosure described a method including providing a fin extending from a substrate, where the fin includes a plurality of semiconductor channel layers defining a channel region for a P-type transistor. In some embodiments, the method further includes forming a first gate dielectric layer surrounding at least three sides of each of the plurality of semiconductor channel layers of the P-type transistor. Thereafter, the method further includes forming a P-type metal film surrounding the first gate dielectric layer. In an example, and after forming the P-type metal film, the method further includes annealing the semiconductor device. After the annealing, and in some embodiments, the method includes removing the P-type metal film.

In another of the embodiments, discussed is a method that includes providing a first fin in an N-type device region and a second fin in a P-type device region, where each of the first and second fins include a plurality of semiconductor channel layers. In some embodiments, the method further includes forming a gate dielectric surrounding each of the plurality of semiconductor channel layers within each of the N-type device region and the P-type device region. In some cases, the method further includes depositing a first metal film surrounding the gate dielectric in the P-type device region. Thereafter, in some embodiments, the method further includes performing a first annealing process to modulate a first flatband voltage (Vfb) of the gate dielectric in the P-type device region, and removing the first metal film.

In yet another of the embodiments, discussed is a method including providing a P-type device in a P-type device region and an N-type device in an N-type device region, where each of the P-type device and the N-type device include a plurality of channel layers, and where the P-type device and the N-type device are electrically isolated from each other by a dielectric wall formed therebetween. In some embodiments, the method further includes forming a dielectric layer on three sides of each of the plurality of channel layers of the P-type device and the N-type device. In some examples, the method further includes depositing a metal film stack over the dielectric layer of the P-type device. In some embodiments, after performing an annealing process to modulate a flatband voltage (Vfb) of the P-type device, the method further includes removing the metal film stack.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of fabricating a semiconductor device, comprising:

providing a fin extending from a substrate, wherein the fin includes a plurality of semiconductor channel layers defining a channel region for a P-type transistor;

forming a first gate dielectric layer surrounding at least three sides of each of the plurality of semiconductor channel layers of the P-type transistor;

forming a P-type metal film surrounding the first gate dielectric layer;

after forming the P-type metal film, annealing the semiconductor device;

after the annealing, removing the P-type metal film; and after removing the P-type metal film, forming a second gate dielectric layer surrounding the first gate dielectric layer.

2. The method of claim 1, wherein the P-type metal film includes at least one of Al, Ti, or N.

3. The method of claim 1, wherein the P-type metal film includes a first layer formed on the first gate dielectric layer, a second layer formed on the first layer, and a third layer formed on the second layer.

4. The method of claim 3, wherein the first layer includes AlN, the second layer includes TiAlN, and the third layer includes AlN.

5. The method of claim 3, wherein the second layer has a greater thickness than the first layer, and wherein the third layer has a greater thickness than the second layer.

6. The method of claim 1, wherein annealing the semiconductor device causes atoms from the P-type metal film to diffuse into the first gate dielectric layer and modulate a flatband voltage (Vfb) of the first gate dielectric layer to form a Vfb-modulated first gate dielectric layer.

7. The method of claim 6, wherein the first gate dielectric layer includes hafnium oxide ($HfO_x$), and wherein the Vfb-modulated first gate dielectric layer includes $HfTiAlNO_x$.

8. The method of claim 1, wherein the first gate dielectric layer includes an interfacial layer (IL) and a first high-K dielectric layer disposed over the IL, wherein the second gate dielectric layer includes a second high-K dielectric layer disposed over the first high-K dielectric layer.

9. The method of claim 1, further comprising:

forming a P-type work-function metal (PWFM) layer surrounding the second gate dielectric layer.

10. The method of claim 1, wherein the P-type transistor includes a P-type gate-all-around (GAA) transistor or a P-type forksheet transistor.

11. The method of claim 1, wherein the annealing the semiconductor device includes annealing the semiconductor device using a rapid thermal anneal (RTA) process.

12. A method, comprising:

providing a first fin in an N-type device region and a second fin in a P-type device region, wherein each of the first and second fins include a plurality of semiconductor channel layers;

forming a gate dielectric surrounding each of the plurality of semiconductor channel layers within each of the N-type device region and the P-type device region;

depositing a first metal film surrounding the gate dielectric in the P-type device region, wherein the first metal film includes at least Al;

performing a first annealing process to modulate a first flatband voltage (Vfb) of the gate dielectric in the P-type device region; and removing the first metal film.

13. The method of claim 12, further comprising:

prior to depositing the first metal film, depositing a second metal film surrounding the gate dielectric in the N-type device region;

performing a second annealing process to modulate a second Vfb of the gate dielectric in the N-type device region; and removing the second metal film.

14. The method of claim 12, wherein the first metal film further includes at least one of Ti or N.

15. The method of claim 13, wherein the second metal film includes La.

16. The method of claim 12, further comprising:

after removing the first metal film, forming a P-type work-function metal (PWFM) layer over the gate dielectric in the P-type device region and an N-type work-function metal (NWFM) layer over the gate dielectric in the N-type device region; and forming an isolation layer that contacts each of the PWFM layer and the NWFM layer and that electrically isolates the first fin in the N-type device region from the second fin in the P-type device region.

17. A method, comprising:

providing a P-type device in a P-type device region and an N-type device in an N-type device region, wherein each of the P-type device and the N-type device include a plurality of channel layers, and wherein the P-type device and the N-type device are electrically isolated from each other by a dielectric wall formed therebetween;

forming a dielectric layer on three sides of each of the plurality of channel layers of the P-type device and the N-type device;

depositing a metal film stack over the dielectric layer of the P-type device;

after performing an annealing process to modulate a flatband voltage (Vfb) of the P-type device, removing the metal film stack; and after removing the metal film stack, forming an additional dielectric layer over the dielectric layer on the three sides of each of the plurality of channel layers of the P-type device and the N-type device.

18. The method of claim 17, wherein the metal film stack includes at least one of Al, Ti, or N.

19. The method of claim 17, further comprising:

after forming the additional dielectric layer, forming a P-type work-function metal (PWFM) layer over the additional dielectric layer of the P-type device and an N-type work-function metal (NWFM) layer over the additional dielectric layer of the N-type device.

20. The method of claim 19, further comprising:

forming a metal capping layer over each of the PWFM layer and the NWFM layer, where a top surface of the metal capping layer is level with a top surface of the dielectric wall.

* * * * *